US012787226B2

(12) United States Patent
Ito et al.

(10) Patent No.: US 12,787,226 B2

(45) Date of Patent: Nov. 3, 2026

(54) INTEGRATED MODULE OF ELECTRICAL APPARATUS AND WIRE HARNESS, AND WIRE HARNESS

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Hideaki Ito, Osaka (JP); Daisuke Miyawaki, Osaka (JP); Yuji Takenaka, Osaka (JP); Housei Mizuno, Osaka (JP)

(73) Assignees: AUTONETWORKS TECHNOLOGIES, LTD., Mie (JP); SUMITOMO WIRING SYSTEMS. LTD, Mie (JP); UMITOMO ELECTRIC INDUSTRIES, LTD., Osaka (JP)

( * ) Notice: Subject to any disclaimer, the term of this patent is extended or adjusted under 35 U.S.C. 154(b) by 196 days.

(21) Appl. No.: 18/729,721

(22) PCT Filed: Jan. 23, 2023

(86) PCT No.: PCT/JP2023/001896
§ 371 (c)(1),
(2) Date: Jul. 17, 2024

(87) PCT Pub. No.: WO2023/145681
PCT Pub. Date: Aug. 3, 2023

(65) Prior Publication Data

US 2025/0202207 A1 Jun. 19, 2025

(30) Foreign Application Priority Data

Jan. 31, 2022 (JP) ................................ 2022-012778

(51) Int. Cl.
*H05K 7/20* (2006.01)
*B60R 16/02* (2006.01)
(Continued)

(52) U.S. Cl.
CPC ....... *H05K 7/2039* (2013.01); *B60R 16/0215* (2013.01); *H01B 7/0045* (2013.01);
(Continued)

(58) Field of Classification Search
CPC ........ H02G 3/03; H02G 3/16; B60R 16/0215; B60R 16/02; H01B 7/0045; H01B 7/421;
(Continued)

(56) References Cited

U.S. PATENT DOCUMENTS 6,291,770 B1 * 9/2001 Casperson .......... B60R 16/0207 174/520
6,323,428 B1 * 11/2001 Takano ............... B60R 16/0215 248/51

(Continued)

FOREIGN PATENT DOCUMENTS

JP 2006-191727 7/2006
JP 2007-202352 8/2007

(Continued)

OTHER PUBLICATIONS

Office Action issued in Japan Patent Application No. 2022-12778, dated Dec. 17, 2024, together with English translation thereof.

(Continued)

*Primary Examiner* — Steven T Sawyer
(74) *Attorney, Agent, or Firm* — Greenblum & Bernstein, P.L.C.

(57) ABSTRACT

An integrated module of an electrical apparatus and a wire harness includes: an electrical apparatus including a heat generation component; and a wire harness including a wiring extending from the electrical apparatus and a heat
(Continued)

conductive plate extending along the wiring, wherein the heat conductive plate is disposed in a position where heat can be transmitted from the heat generation component to the heat conductive plate with respect to the electrical apparatus.

11 Claims, 12 Drawing Sheets

(51) Int. Cl.
*H01B 7/00* (2006.01)
*H02G 3/03* (2006.01)
*H02G 3/16* (2006.01)
*H05K 1/02* (2006.01)

(52) U.S. Cl.
CPC ................. *H02G 3/03* (2013.01); *H02G 3/16* (2013.01); *H05K 1/0203* (2013.01); *H05K 7/20* (2013.01)

(58) Field of Classification Search
CPC ........ H01B 7/428; H05K 7/2039; H05K 7/00; H05K 7/20; H05K 7/20418; H05K 1/0201; H05K 1/0203; H05K 1/0204
See application file for complete search history.

(56) References Cited

U.S. PATENT DOCUMENTS

| | | | | | |
|---|---|---|---|---|---|
| 2005/0153576 | A1* | 7/2005 | Fukuda | H01B 7/0045 | 439/34 |
| 2007/0086170 | A1* | 4/2007 | Liang | H05K 9/0032 | 257/E23.102 |
| 2010/0027232 | A1* | 2/2010 | Kasuya | B60R 16/0215 | 361/807 |
| 2010/0051314 | A1* | 3/2010 | Watanabe | H01B 7/428 | 156/60 |
| 2011/0133548 | A1* | 6/2011 | Toyama | B60L 50/64 | 307/9.1 |
| 2018/0020558 | A1* | 1/2018 | Saito | H05K 5/0082 | |
| 2019/0372321 | A1 | 12/2019 | Takamatsu et al. | | |
| 2020/0172027 | A1* | 6/2020 | Mizuno | H02G 3/30 | |
| 2020/0172031 | A1* | 6/2020 | Nakano | H02H 3/087 | |

FOREIGN PATENT DOCUMENTS

| | | |
|---|---|---|
| JP | 2012-94695 | 5/2012 |
| JP | 2019-206311 | 12/2019 |
| JP | 2021-168280 | 10/2021 |

OTHER PUBLICATIONS

International Preliminary Report on Patentability issued in Inernational Patent Application No. PCT/JP2023/001896, dated Aug. 8, 2024, along with an English translation thereof.
Office Action issued in Japan Patent Application No. 2022-12778, dated Mar. 25, 2025, together with English translation thereof.
International Search Report issued in Inernational Patent Application No. PCT/JP2023/001896, dated Apr. 18, 2023, along with an English translation thereof.

* cited by examiner

INTEGRATED MODULE OF ELECTRICAL APPARATUS AND WIRE HARNESS, AND WIRE HARNESS

TECHNICAL FIELD

The present disclosure relates to an integrated module of an electrical apparatus and a wire harness and a wire harness.

BACKGROUND ART

Patent Document 1 discloses an interconnection box electrically interconnecting an instrument panel harness, an engine room harness, a door harness, and a floor harness.

PRIOR ART DOCUMENTS

Patent Document(s)

Patent Document 1: Japanese Patent Application Laid-Open No. 2007-202352

SUMMARY

Problem to be Solved by the Invention

Desired is increase of heat radiation properties in an electrical apparatus as a connection destination of a wire harness.

Accordingly, an object is to increase heat radiation properties in an electrical apparatus as a connection destination of a wire harness.

Means to Solve the Problem

An integrated module of an electrical apparatus and a wire harness according to the present disclosure is an integrated module of an electrical apparatus and a wire harness including: an electrical apparatus including a heat generation component; and a wire harness including a wiring extending from the electrical apparatus and a heat conductive plate extending along the wiring, wherein the heat conductive plate is disposed in a position where heat can be transmitted from the heat generation component to the heat conductive plate with respect to the electrical apparatus.

A wire harness according to the present disclosure is a wire harness including: a wiring extending from an electrical apparatus including a heat generation component; and heat conductive plate extending along the wiring, wherein the heat conductive plate includes a wiring overlapping region extending to a region where the wiring is overlapped and an apparatus overlapping region disposed in a position where heat can be transmitted from the heat generation component to the heat conductive plate with respect to the electrical apparatus.

Effects of the Invention

According to the present disclosure, heat radiation properties can be increased and a size can be reduced in an electrical apparatus as a connection destination of a wire harness.

DESCRIPTION OF EMBODIMENT(S)

Description of Embodiments of Present Disclosure

Figure 1:
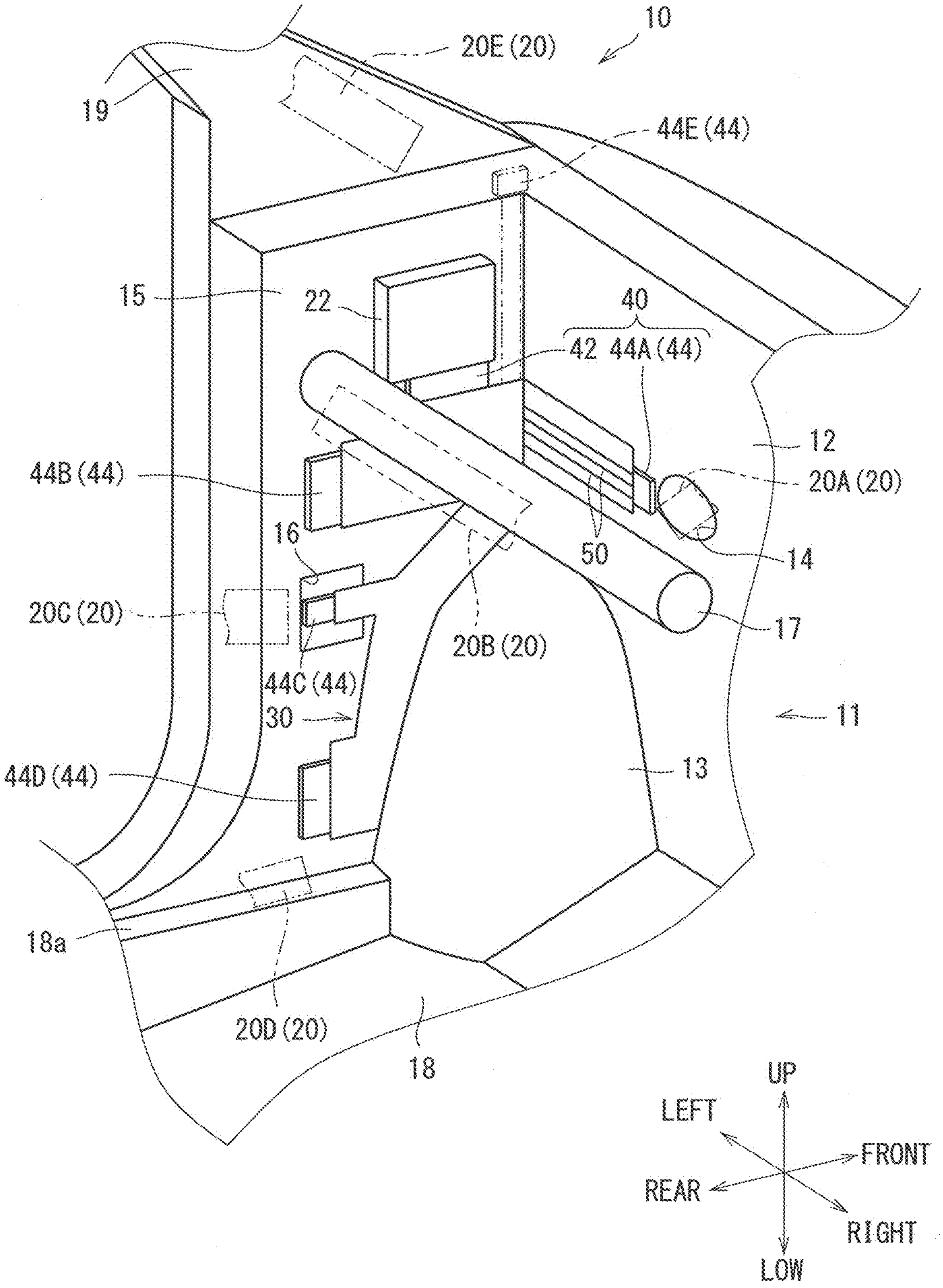
FIG. 1 is a perspective view illustrating an integrated module according to an embodiment.

Embodiments of the present disclosure are listed and described firstly.

An integrated module of an electrical apparatus and a wire harness according to the present disclosure is as follows.

(1) An integrated module of an electrical apparatus and a wire harness includes: an electrical apparatus including a heat generation component; and a wire harness including a wiring extending from the electrical apparatus and a heat conductive plate extending along the wiring, wherein the heat conductive plate is disposed in a position where heat can be transmitted from the heat generation component to the heat conductive plate with respect to the electrical apparatus.

According to the present disclosure, heat is transmitted from the heat generation component to the heat conductive plate. The heat conductive plate is a plate extending along a wiring. Thus, heat from the heat generation component is effectively radiated by the heat conductive plate, and heat radiation properties of the electrical apparatus as a connection destination of the wire harness can be increased.

(2) In the integrated module of the electrical apparatus and the wire harness according to (1), the wire harness may be flat as a whole. Effective heat radiation can be achieved by the heat conductive plate which can be widely set.

(3) In the integrated module of the electrical apparatus and the wire harness according to (1) or (2), the heat conductive plate may include a wiring overlapping region extending along the wiring and an apparatus overlapping region overlapped with the electrical apparatus. Accordingly, heat can be easily transmitted from the heat generation component to the heat conductive plate using the apparatus overlapping region of the heat conductive plate.

(4) The integrated module of the electrical apparatus and the wire harness according to (3) may further include a heat conductor intervening between the heat generation component and the apparatus overlapping region. Accordingly, heat of the heat generation component can be effectively transmitted to the electrical apparatus by the heat conductor.

(5) In the integrated module of the electrical apparatus and the wire harness according to (4), it is applicable that the electrical apparatus includes a case housing the heat generation component, an opening is formed in the case, and the heat conductor intervenes between the heat generation component and the apparatus overlapping region while passing through the opening. In this case, the heat conductor passes through the opening of the case, thus heat of the heat generation component is effectively transmitted to the heat conductive plate.

(6) In the integrated module of the electrical apparatus and the wire harness according to (4) or (5), it is applicable that the electrical apparatus includes a substrate to which the heat generation component is mounted, and the substrate intervenes between the heat generation component and the heat conductor.

Heat of the heat generation component can be transmitted from the heat generation component to the apparatus overlapping region via the substrate. Even when the heat generation component is mounted to the substrate on a side opposite to the heat conductive plate, heat of the heat generation component can be easily radiated via the heat conductive plate.

(7) In the integrated module of the electrical apparatus and the wire harness according to any one of (4) to (6), the heat conductor may include heat conductive insulation rubber. In this manner, when the heat conductor includes the heat conductive insulation rubber, heat can be easily transmitted from the heat generation component to the heat conductive plate while the heat generation component and the heat conductive plate are insulated from each other.

(8) In the integrated module of the electrical apparatus and the wire harness according to any one of (4) to (7), the heat conductor may be fixed to the heat conductive plate. In this case, the heat conductor can be easily made to intervene between the heat generation component and the heat conductive plate in integrating the electrical apparatus and the wire harness.

(9) In the integrated module of the electrical apparatus and the wire harness according to any one of (1) to (8), the heat conductive plate may be fixed to the electrical apparatus. In this manner, when the heat conductive plate is fixed to the electrical apparatus, easily kept is a state where heat can be transmitted from the heat generation component to the heat conductive plate.

(10) In the integrated module of the electrical apparatus and the wire harness according to any one of (1) to (9), it is applicable that the wire harness includes an apparatus connector connected to a connector of the electrical apparatus and a first harness connector and a second harness connector to which connectors of counterpart wire harnesses are connected, respectively, and the wiring includes a plurality of wirings branched from the apparatus connector to be connected to the first harness connector and the second harness connector. In this case, the number of connectors connected to the electrical apparatus can be reduced. Accordingly, the number of connectors of the electrical apparatus can be reduced, and the electrical apparatus can be downsized.

(11) In the integrated module of the electrical apparatus and the wire harness according to (10), the wiring may include a through circuit wiring connecting the first harness connector and the second harness connector. In this case, plural types of counterpart harnesses can also be connected via the present wire harness, thus connection of the plural types of counterpart wire harnesses and connection between the plural types of counterpart wire harness and the apparatus are simplified.

A wire harness according to the present disclosure is as follows.

(12) A wire harness includes: a wiring extending from an electrical apparatus including a heat generation component; and a heat conductive plate extending along the wiring, wherein the heat conductive plate includes a wiring overlapping region extending to a region where the wiring is overlapped and an apparatus overlapping region overlapped with the electrical apparatus and disposed in a position where heat can be transmitted from the heat generation component to the heat conductive plate with respect to the electrical apparatus.

According to the present disclosure, heat is transmitted from the heat generation component to the heat conductive plate. The heat conductive plate is a plate extending along a wiring. Thus, heat from the heat generation component is effectively radiated by the heat conductive plate, and heat radiation properties of the electrical apparatus as a connection destination of the wire harness can be increased.

DETAILED DESCRIPTION OF EMBODIMENT OF PRESENT DISCLOSURE

Specific examples of an integrated module of an electrical apparatus and a wire harness and a wire harness according to the present disclosure are described hereinafter with reference to the diagrams. The present disclosure is not limited to these examples, but is indicated by claims, and it is intended that meanings equivalent to claims and all modifications within a scope of claims are included.

Embodiment

Figure 2:
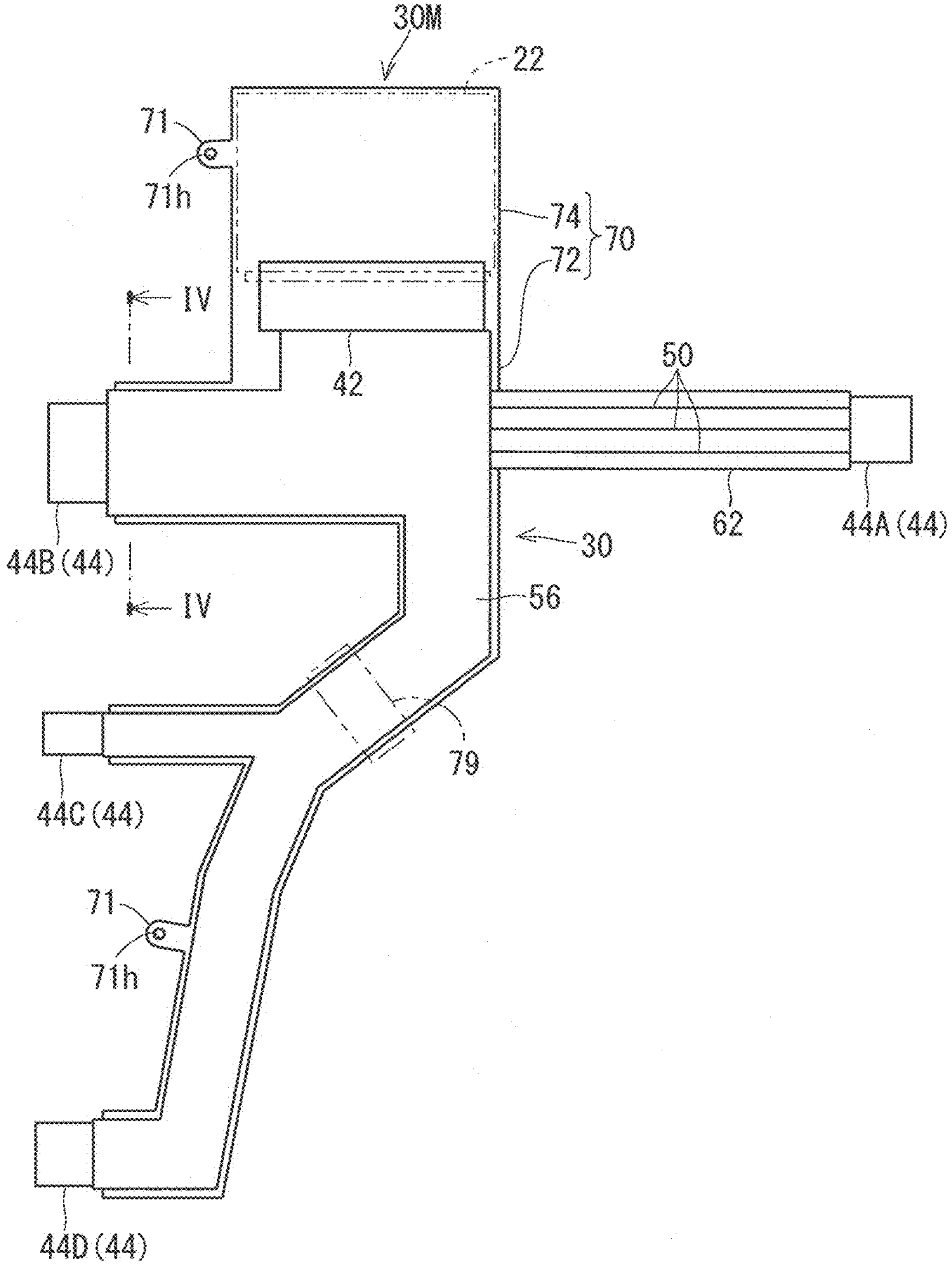
FIG. 2 is a plan view illustrating the integrated module.
Figure 3:
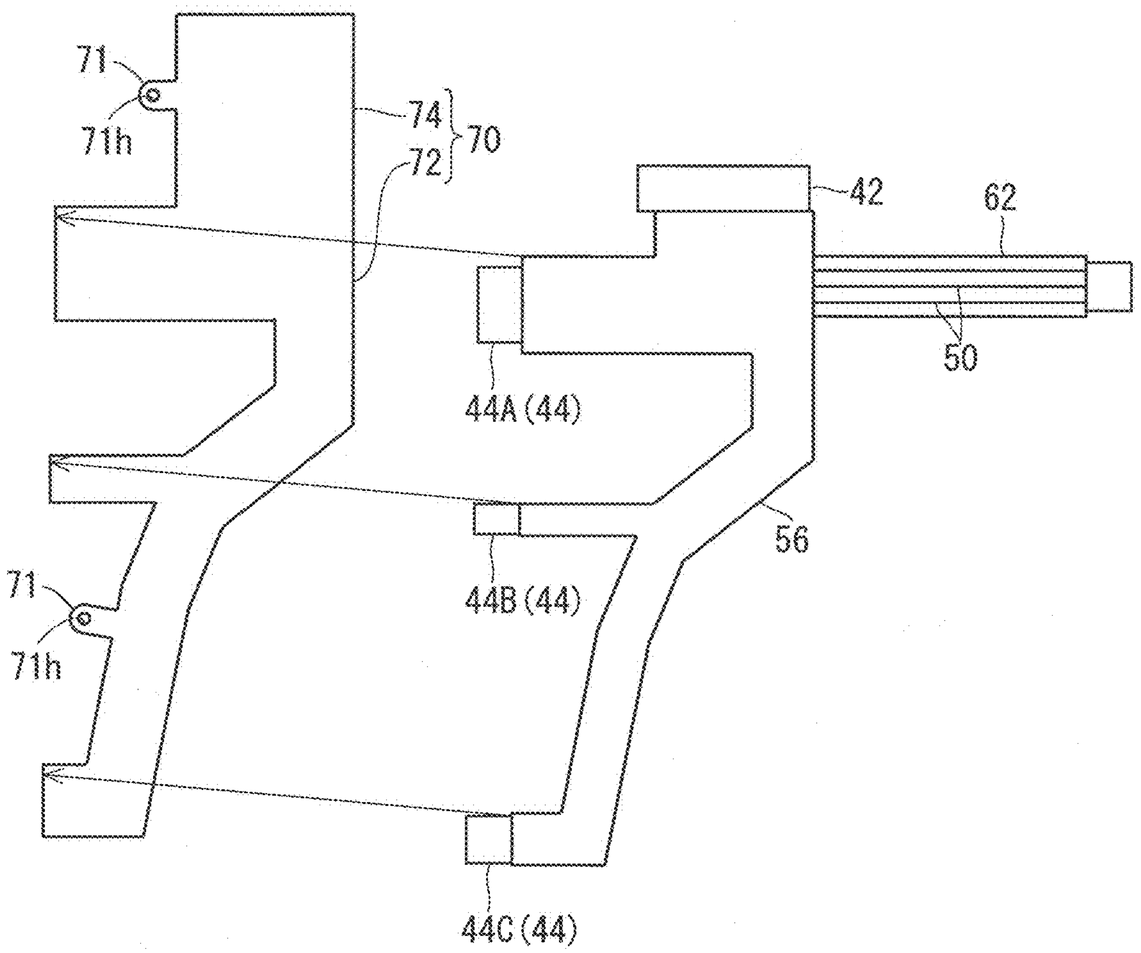
FIG. 3 is an exploded plan view illustrating the integrated module.
Figure 4:
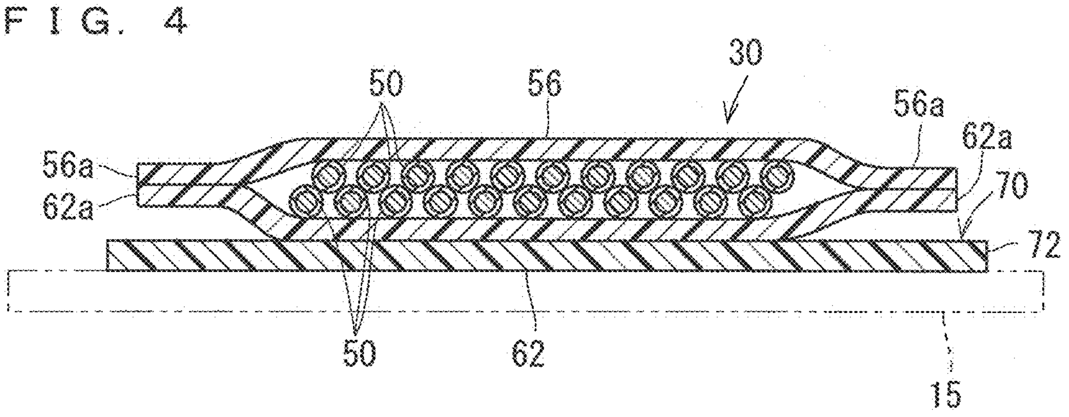
FIG. 4 is a cross-sectional view along a IV-IV line in FIG. 2.

An integrated module of an electrical apparatus and a wire harness and a wire harness according to the present embodiment are described hereinafter. FIG. 1 is a perspective view illustrating an integrated module 30M according to the embodiment disposed in a vehicle 10. A front-back direction (FRONT, REAR), a right-left direction (RIGHT, LEFT), and an up-down direction (UP, LOW) correspond to a front-back direction, a right-left direction, and an up-down direction in the vehicle 10, respectively. FIG. 2 is a plan view illustrating the integrated module 30M according to the embodiment. FIG. 3 is an exploded plan view illustrating the integrated module 30M according to the embodiment. FIG. 4 is a cross-sectional view along a IV-IV line in FIG. 2.

<Whole Configuration of Integrated Module of Electrical Apparatus and Wire Harness>

The integrated module 30M of an electrical apparatus 22 and a wire harness 30 is disposed in the vehicle 10, for example. The integrated module 30M includes the electrical apparatus 22 and the wire harness 30. The electrical apparatus 22 is an apparatus including a heat generation component 24 (refer to FIG. 5) described hereinafter. The wire harness 30 includes a wiring 50 and a heat conductive plate 70, and has a flat shape as a whole. The wiring 50 extends from the electrical apparatus 22. In the present embodiment, the plurality of wirings 50 are disposed to follow a flat route. The heat conductive plate 70 is a plate extending along the wiring 50. In other words, the plurality of wirings 50 include a portion extending along the heat conductive plate 70. The heat conductive plate 70 is disposed along the flat form on which the plurality of wirings 50 extend, and this configuration constitutes a flat form as the whole wire harness 30. The wire harness 30 has the flat form, thus can be easily disposed along one main surface of a panel.

The wire harness 30 intervenes between the plural types of counterpart wire harness 20 and the electrical apparatus 22 to connect the plural types of counterpart wire harness 20 and also connect each of the plural types of counterpart wire harness 20 and the electrical apparatus 22. The plural types of counterpart wire harness 20 are disposed in areas different from each other in the vehicle 10.

<Arrangement Area and Connection Relationship of Integrated Module>

Examples of an arrangement area of the wire harness 30 in the vehicle 10, the counterpart wire harness 20, and the electrical apparatus 22 are firstly described for a purpose of convenience.

The arrangement area of the wire harness 30 in the vehicle 10 is not particularly limited, but can be appropriately set. From a viewpoint that the wire harness 30 intervenes between the plural types of counterpart wire harnesses 20, the arrangement area of the wire harness 30 is preferably an area close to a boundary between a plurality of areas where the plural types of counterpart wire harnesses 20 are disposed, respectively. In the description herein, the arrangement area of the wire harness 30 is an area where a dashboard panel 11 and a cowl side panel 15 intersect with each other.

The dashboard panel 11 partitions an engine room and a vehicle interior in the vehicle 10. An area closer to the front side than the dashboard panel 11 is the engine room, and an area closer to a rear side than the dashboard panel 11 is the vehicle interior. An instrument panel is normally provided closer to the rear side than the dashboard panel 11, and the instrument panel is exposed to the vehicle interior. The dashboard panel 11 includes a body part 12 and a protrusion part 13. A main surface of the body part 12 of the dashboard panel 11 extends in the right-left direction and an up-down direction in the vehicle 10. The protrusion part 13 is provided on a lower side of an end portion of the body part 12 in the right-left direction. The protrusion part 13 a part protruding to a side of the vehicle interior from the body part 12. The protrusion part 13 is a part for providing a wheel house to the vehicle 10.

The cowl side panel 15 is continuously formed with the dashboard panel 11 in each of a left side and a right side of the dashboard panel 11. A main surface of the cowl side panel 15 extends in the front-back direction and the up-down direction in the vehicle 10. FIG. 1 illustrates an area where the cowl side panel 15 provided on the left side of the dashboard panel 11 and the dashboard panel 11 intersect with each other. An edge portion on a lower front side of the cowl side panel 15 is bended in accordance with the protrusion part 13.

An end portion of the instrument panel reinforcement 17 is fixed to the cowl side panel 15. The instrument panel reinforcement 17 is provided between the dashboard panel 11 and the instrument panel. The instrument panel reinforcement 17 is a rod-like member elongated in the right-left direction.

The floor panel 18 is provided on a lower side of the area where the dashboard panel 11 and the cowl side panel 15 intersect with each other. A main surface of the floor panel 18 extends in the front-back direction and the right-left direction in the vehicle 10.

When the arrangement area of the wire harness 30 is the area where the dashboard panel 11 and the cowl side panel 15 intersect with each other, assumed as the counterpart wire harnesses 20 are the engine room harness 20A, the instrument panel harness 20B, the door harness 20C, and the floor harness 20D, for example. The engine room harness 20A is disposed in an engine room. The instrument panel harness 20B is disposed to extend along the instrument panel reinforcement 17. The door harness 20C is disposed in a door. The floor harness 20D is disposed along a floor. A roof harness 20E may be assumed as the counterpart wire harness 20. The roof harness 20E is disposed in a roof.

In the present disclosure, a term of engine room is an expediential address term of a front room located in front of a vehicle interior, thus an engine needs not necessarily be disposed in the engine room. In the similar manner, in the present disclosure, a term of the engine room harness 20A is an expediential address term of the counterpart wire harness 20 disposed in the front room located in front of the vehicle interior.

The arrangement area of the wire harness 30 and the arrangement area of the engine room harness 20A are partitioned by the dashboard panel 11. Herein, a through hole 14 is formed in the dashboard panel 11. The wire harness 30 and the engine room harness 20A are connected through the through hole 14. In the similar manner, the arrangement area of the wire harness 30 and the arrangement area of the door harness 20C are partitioned by the cowl side panel 15. Herein, a through hole 16 is formed in the cowl side panel 15. The wire harness 30 and the door harness 20C are connected through the through hole 16. A rocker part 18*a*, for example, is located in a side edge of the floor panel 18 in the vehicle. An end portion of the floor harness 20D connected to the wire harness 30 extends in the front-back direction of the vehicle along the rocker part 18*a*. The roof is located on an upper side of the area where the dashboard panel 11 and the cowl side panel 15 intersect with each other. For example, an end portion of the roof harness 20E connected to the wire harness 30 extends from the roof to the area where the dashboard panel 11 the cowl side panel 15 intersect with each other or near the area along an A pillar 19.

<Electrical Apparatus>

The electrical apparatus 22 is disposed in the same area as the arrangement area of the wire harness 30. In the example illustrated in FIG. 1, the electrical apparatus 22 is fixed to the cowl side panel 15. The electrical apparatus 22 may be fixed to the dashboard panel 11, the instrument panel reinforcement 17, or the floor panel 18, for example.

The electrical apparatus 22 is an electrical apparatus including a heat generation component, and is an electrical control unit (ECU), for example. One central ECU and a plurality of zone ECUs may be provided in the vehicle 10. The zone ECU is provided for each zone sectioned into a plurality of areas in the vehicle 10. The zone ECU mainly controls the apparatus located in the zone. The central ECU achieves control of summing up the plurality of zone ECUs and collaborating in the whole vehicle 10. The electrical apparatus 22 may be the zone ECU, for example. In this case, the electrical apparatus 22 as the zone ECU controls a plurality of apparatuses as connection destinations of the engine room harness 20A, the instrument panel harness 20B, the door harness 20C, and the floor harness 20D, for example.

The electrical apparatus 22 as the ECU may be a general ECU other than the zone ECU. The electrical apparatus 22 needs not be the ECU, but may be a junction block (also referred to as an electrical junction box), for example.

<Wire Harness>

The wire harness 30 includes the plurality of wirings 50 and the heat conductive plate 70. In the present embodiment, the wire harness 30 further includes plural types of connectors 42 and 44. The plural types of connectors 42 and 44 are connected to connection destinations different from each other, respectively. The plural types of connectors 42 and 44 are disposed in positions corresponding to connection positions where the connectors 42 and 44 are connected to the electrical apparatus 22 and the counterpart wire harness 20 as the connection destinations, respectively.

In the present embodiment, the plurality of wirings 50 are fixed to the base members 56 and 62, thereby being kept in a flat form. The base members 56 and 62 are resin sheets, for example. The base members 56 and 62 are formed into shapes branched or curved in accordance with positions of the plural types of connectors 42 and 44 described above and a route of the wiring 50. The plurality of wirings 50 are fixed to the base member 56 or the base member 62. The base member 56 and the base member 62 are stacked, thus the plurality of wirings 50 are collected in a flat form. When the wiring 50 is disposed between the base members 56 and 62, the wiring 50 is easily protected by the base members 56 and 62. The wire harness 30 needs not be flat. It is also applicable that the wire harness 30 is bundled by an adhesive tape or a banding member such as a banding band, and the wire harness 30 is partially or wholly bundled to be kept in a circular shape.

The connectors 42 and 44 are connected to a plurality of end portions of the wirings 50, respectively. The wiring 50 is connected to the electrical apparatus 22 via the connector 42, and is connected to the counterpart wire harness 20 via the connector 44. The wiring 50 needs not be connected to the electrical apparatus 22 and the counterpart wire harness 20 via the connectors 42 and 44. At least some of the wirings 50 may be a wiring directly led out from the electrical apparatus 22 or a wiring directly connected to a wiring of the counterpart wire harness 20.

The heat conductive plate 70 is a plate extending along the plurality of wirings 50. In the present embodiment, the heat conductive plate 70 has a planar shape. The heat conductive plate 70 may be bended in a thickness direction. The heat conductive plate 70 is a plate having favorable heat conductivity such as a metal plate made of iron, aluminum, or copper, for example. The heat conductivity of the heat conductive plate 70 is larger than that of air, and is preferably larger than that of resin. For example, the heat conductivity of the heat conductive plate 70 is equal to or larger than 80 (W/mK), and is preferably equal to or larger than 230 (W/mK).

The heat conductive plate 70 is disposed in a position where heat can be transmitted from the heat generation component 24 to the heat conductive plate 70 with respect to the electrical apparatus 22. The state where the heat conductive plate 70 is disposed in the position where the heat can be transmitted from the heat generation component 24 to the heat conductive plate 70 with respect to the electrical apparatus 22 includes a case where the heat conductive plate 70 has contact with the heat generation component 24 via a heat transmission material other than air or has direct contact with the heat generation component 24, for example. That is to say, it is sufficient that the heat conductivity is favorably achieved compared with a case where air mainly intervenes between the electrical apparatus 22 and the heat conductive plate 70.

In the present embodiment, the heat conductive plate 70 includes a wiring overlapping region 72 and an apparatus overlapping region 74.

The wiring overlapping region 72 is a region extending along the wiring 50. In the present embodiment, the wiring overlapping region 72 extends along the whole route of the wiring 50 except for a region adjacent to the connector 44 on the end portion of the wiring 50. It is sufficient that the wiring overlapping region 72 is overlapped with at least a part of the route of the wiring 50. The wiring overlapping region 72 may include an additional region which is not overlapped with the route of the wiring 50.

The apparatus overlapping region 74 is a region overlapped with the electrical apparatus 22. In the present embodiment, the connector 42 is connected to the electrical apparatus 22. Thus, the electrical apparatus 22 is located on an extended line of the connector 42 in the wiring 50. The apparatus overlapping region 74 is a region extending from the wiring overlapping region 72 to a region where the electrical apparatus 22 is located. In the present embodiment, the apparatus overlapping region 74 is overlapped with the whole electrical apparatus 22. It is sufficient that the apparatus overlapping region 74 is overlapped with at least a part of the electrical apparatus 22. The apparatus overlapping region 74 may include an additional region which is not overlapped with the electrical apparatus 22.

The heat conductive plate 70 may include a fixing part to fix the heat conductive plate 70 to a vehicle by a fixing tool such as a screw or a clip. FIG. 1 to FIG. 3 exemplify a part of a fixing piece 71 as an example of the fixing part. The fixing piece 71 is a partial planar part extending to an outer side from an outer peripheral edge of the heat conductive plate 70, and includes an insertion hole 71*h*. The fixing piece 71 is fixed to the vehicle (for example, the cowl side panel 15) by a screw S, for example, while the fixing piece 71 has contact with the vehicle. The heat conductive plate 70 has contact with the vehicle, thus heat is easily transmitted from the heat conductive plate 70 to the vehicle. The plurality of fixing pieces 71 are provided around the heat conductive plate 70 as necessary.

A fixing structure of fixing the heat conductive plate 70 to the vehicle is not limited to the above example. The heat conductive plate 70 may be fixed to the vehicle by the other fitting structure or welding, for example, or may also be supported at a constant position by the electrical apparatus 22, for example.

The wiring 50 and the base members 56 and 62 supporting the wiring 50 may be integrally formed with the heat conductive plate 70. For example, one main surface (on a side opposite to a side having contact with the vehicle) of the heat conductive plate 70, on which the wiring 50 and the base members 56 and 62 are disposed, may be bundled with an adhesive tape or a banding member 79 such as a banding band (FIG. 2). The wiring 50 and the base members 56 and 62 may be integrally formed with the heat conductive plate 70 not only by the above example but also by a double-sided adhesive tape, an adhesive agent, or a screw, for example.

When the wiring 50 and the heat conductive plate 70 are integrally formed with each other, the heat conductive plate 70 can have a role in keeping the wiring 50 in a flat state along the heat conductive plate 70.

<Relationship Between Heat Conductive Plate and Electrical Apparatus>

Figure 5:
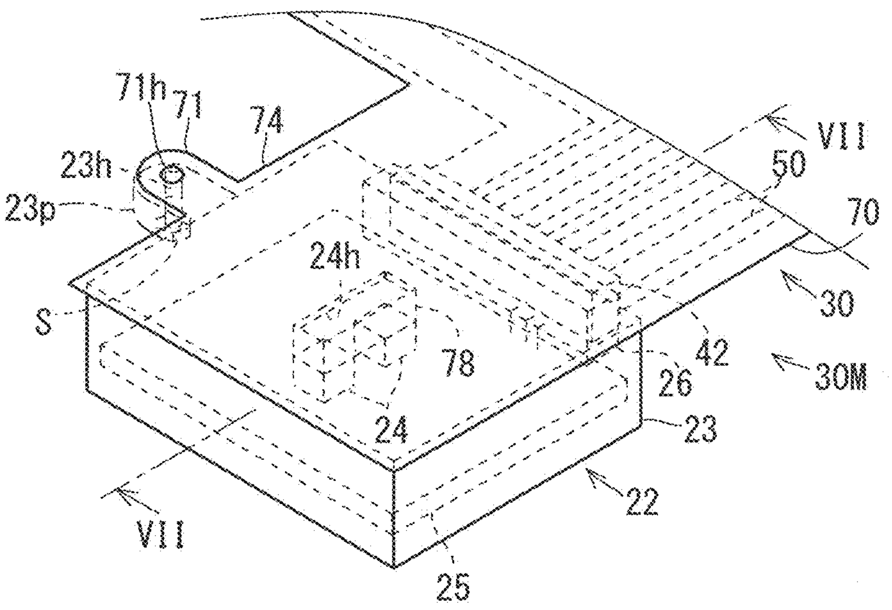
FIG. 5 is a cross-sectional view illustrating a positional relationship between a heat conductive plate and an electrical apparatus.
Figure 6:
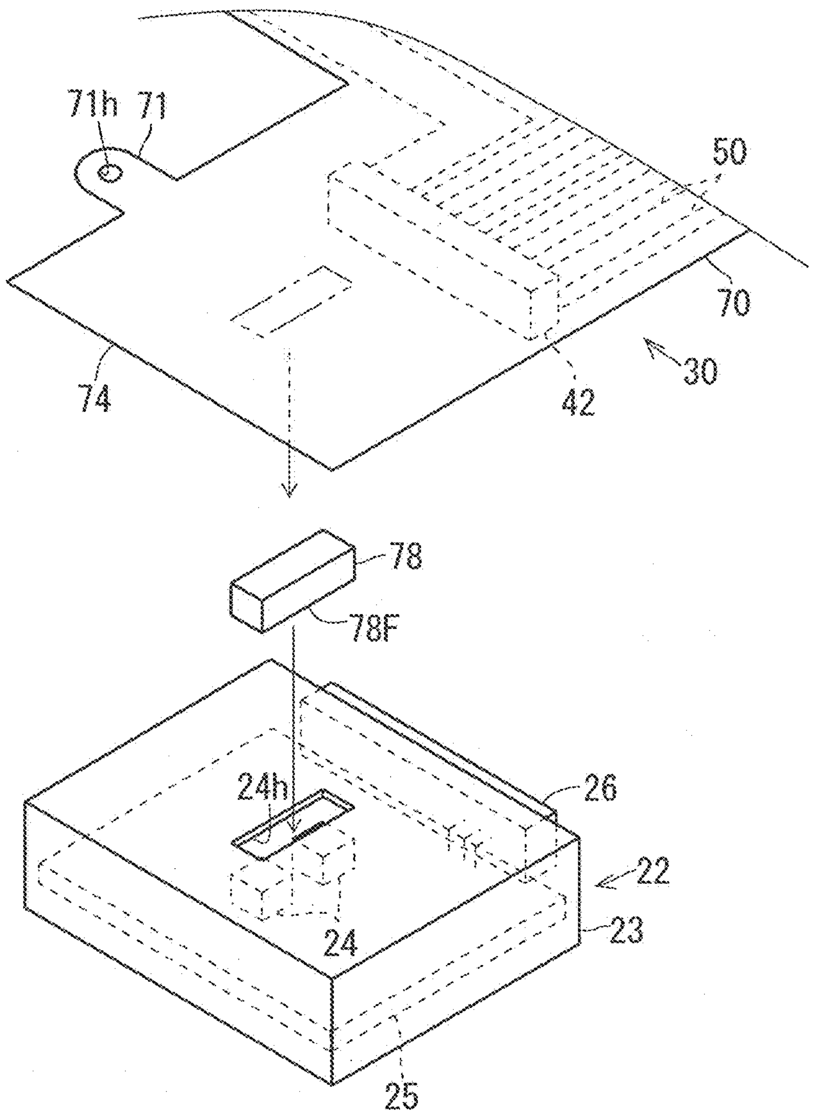
FIG. 6 is an exploded perspective view of the heat conductive plate and the electrical apparatus.
Figure 7:
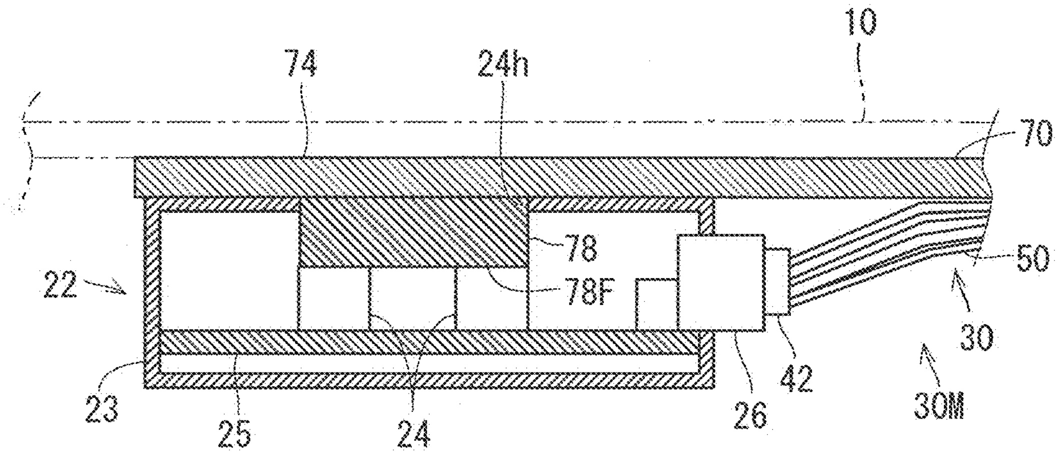
FIG. 7 is a partial cross-sectional view along a VII-VII line in FIG. 5.

Described is a relationship between the heat conductive plate 70 and the electrical apparatus 22. FIG. 5 is a cross-sectional view illustrating a positional relationship between the heat conductive plate 70 and the electrical apparatus 22. FIG. 6 is an exploded perspective view of the heat conductive plate 70 and the electrical apparatus 22. FIG. 7 is a partial cross-sectional view along a VII-VII line in FIG. 5. FIG. 7 illustrates a case 23, a circuit substrate 25, a heat conductor 78, and the heat conductive plate 70 in cross section.

The electrical apparatus 22 includes the heat generation component 24. The heat generation component 24 is an element generating heat in an electrical circuit such as an electromagnetic relay, a semiconductor switch, a fuse, an integrated circuit (IC), for example. In the present embodiment, the electrical apparatus 22 includes the case 23, the circuit substrate 25, and a connector 26.

The case 23 is a box formed of resin, for example. In the present embodiment, the case 23 is formed into a flat box-like shape. The case 23 houses the heat generation component 24.

The circuit substrate 25 is fixed inside the case 23. The circuit substrate 25 has a circuit pattern formed of a copper foil, for example. The heat generation component 24 is mounted to the circuit substrate 25. The number and position of the heat generation components 24 are optionally set. In the present embodiment, the plurality of (two in FIG. 7) the heat generation components 24 are mounted and fixed at intervals on the circuit substrate 25. The other electrical component may be mounted to the circuit substrate 25. The heat generation component 24 faces one plate part of the case 23.

The connector 26 passes through inside and outside the case 23 in one side plate part. A terminal of the connector 26 is electrically connected to a circuit pattern of the circuit substrate 25 in the case 23. The apparatus connector 42 of the wire harness 30 is connected to this connector 26, thus the wiring 50 is connected to a circuit in the electrical apparatus 22.

An opening 24*h* is formed in a position in the case 23 corresponding to the heat generation component 24. It is sufficient that the opening 24*h* is formed in a position where at least a part of the heat generation component 24 is exposed outside. That is to say, it is sufficient that when a plate part including the opening 24*h* in the case 23 is observed from outside along a direction perpendicular to the plate part, at least a part of the opening 24*h* and at least a part of the heat generation component 24 are overlapped with each other. In FIG. 5 and FIG. 6, the opening 24*h* connects a plurality of regions overlapped with the plurality of heat generation components 24. That is to say, the opening 24*h* is formed as one opening 24*h* in the plurality of heat generation components 24 in common.

The apparatus overlapping region 74 in the heat conductive plate 70 is disposed along the plate part including the opening 24*h* in the case 23. The heat conductive plate 70 is preferably kept in a constant position with respect to the electrical apparatus 22. The electrical apparatus 22 may be fixed to the heat conductive plate 70. For example, it is applicable that a fixing piece 23*p* including a hole 23*h* is formed to protrude from the case 23, and is overlapped with the fixing piece 71 formed in the heat conductive plate 70. In this case, the screw S may be inserted into the holes 23*h* and 71*h* to be screwed to a nut. When the nut is provided to a vehicle, the electrical apparatus 22 and the heat conductive plate 70 can be collectively fixed to the vehicle 10. FIG. 6 exemplifies one fixing piece 23*p*. The plurality of fixing pieces 23*p* are provided around the case 23 as necessary. It is also applicable that the heat conductive plate 70 and the case 23 are separately fixed to the vehicle 10, for example, and are kept to have a constant positional relationship.

The integrated module 30M includes the heat conductor 78 intervening between the heat generation component 24 and the apparatus overlapping region 74. The heat conductor 78 has higher heat conductivity than air, and preferably has higher conductivity than resin constituting the case 23. For example, the heat conductivity of the heat conductor 78 is equal to or larger than 1.0 (W/mK), and is preferably equal to or larger than 6.5 (W/mK).

For example, the heat conductor 78 may be heat conductive insulation rubber having favorable heat conductivity and having insulation properties. The heat conductive rubber is rubber including a filler (magnesium oxide) having favorable heat conductivity and having insulation properties, for example. When the heat conductor 78 is rubber, the heat conductor 78 can be firmly attached to the heat generation component 24 and the heat conductive plate 70 easily. The heat conductor 78 can be attached to an inner peripheral surface of the opening 24*h* easily. The heat conductor 78 may be ceramics or heat conductive grease.

The heat conductor 78 is formed into a shape so that it can be disposed in the opening 24*h*. In the present embodiment, the opening 24*h* has a quadrangular shape, and the heat conductor 78 has a quadrangular parallelepiped shape so that it can be disposed in the opening 24*h*. A surface 78F of the heat conductor 78 on a side of the heat generation component 24 can face the heat generation component 24. It is sufficient that the surface 78F of the heat conductor 78 faces at least a part of the heat generation component 24. The surface 78F of the heat conductor 78 may include a part protruding from the heat generation component 24. In the present embodiment, the surface 78F of the heat conductor 78 extends to have the same size as the opening 24*h*. Thus, the surface 78F of the heat conductor 78 can have contact with whole upper surfaces of the plurality of heat generation components 24, and also extends to an area between the plurality of heat generation components 24.

The heat conductor 78 may have the other shape different from the parallelepiped shape. For example, it is applicable that the heat conductor 78 has a columnar shape, and an end surface of a circular shape is disposed to face the upper surface of the heat generation component 24.

An outer peripheral surface of the heat conductor 78 is preferably disposed to have contact with an inner peripheral surface of the opening 24*h*. Accordingly, water or dust, for example, hardly enters the case 23 through between the heat conductor 78 and the opening 24*h*.

The other inclusion may intervene between the heat generation components 24 of and the heat conductor 78 or between the heat conductor 78 and the apparatus overlapping region 74. The inclusion is a heat conductive sheet, a heat conductive adhesive agent, a heat conductive double-sided adhesive tape, or a heat conductive grease increasing adhesiveness to the other member. When the inclusion is the heat conductive adhesive agent or the heat conductive double-sided adhesive tape, the heat conductor 78 can be kept to be fixed to the heat generation component 24 or the apparatus overlapping region 74.

When the heat conductor 78 is fixed to the heat conductive plate 70, the heat conductor 78 can be easily made to intervene between the heat generation component 24 and the apparatus overlapping region 74 in an operation of integrating the electrical apparatus 22 and the wire harness 30. For example, when the heat conductor 78 is inserted into the opening 24*h* in assembling the electrical apparatus 22 to the heat conductive plate 70, the heat conductor 78 is disposed between the heat generation component 24 and the apparatus overlapping region 74.

Figure 8:
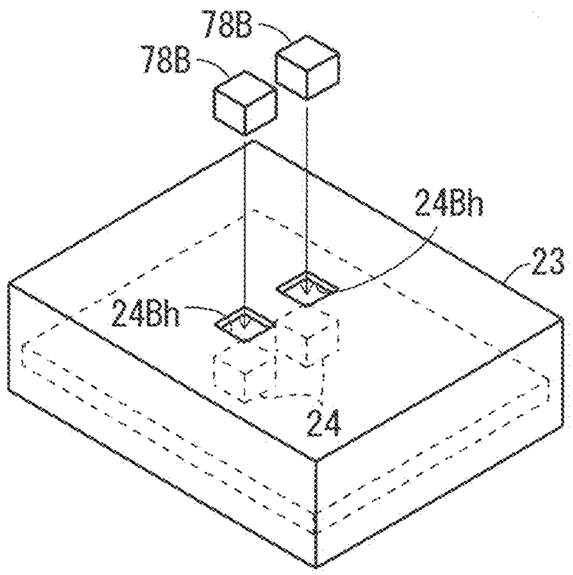
FIG. 8 is a perspective view illustrating an opening and a heat conductor of the electrical apparatus according to a first modification example.

FIG. 8 illustrates a first modification example of an opening and a heat conductor. As illustrated in FIG. 8, a plurality of openings 24Bh corresponding to the opening 24*h* may be formed to correspond to each heat generation component 24. In FIG. 8. the opening 24Bh is formed immediately above each of the plurality of heat generation components 24, and the plurality of openings 24B are not connected but are separated from each other. In this case, a plurality of heat conductors 78B corresponding to the heat conductor 78 are disposed in the plurality of openings 24Bh, respectively, and are disposed to intervene between each of the plurality of heat generation components 24 and the heat conductive plate 70. In this case, the opening 24Bh formed in the case 23 can be downsized, and rigidity of the case 23 can be increased.

Figure 9:
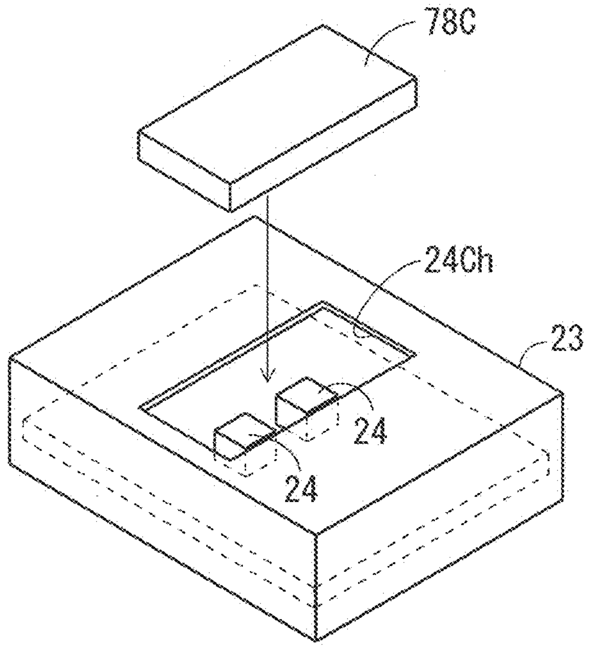
FIG. 9 is a perspective view illustrating an opening and a heat conductor of the electrical apparatus according to a second modification example.

FIG. 9 illustrates a second modification example of an opening and a heat conductor. As illustrated in FIG. 9, an opening 24Ch corresponding to the opening 24*h* is larger than the opening 24*h*. Thus, the opening 24Ch is formed in a region larger than the region where the plurality of heat generation components 24 are located. In FIG. 9, the opening 24Ch is formed to widely extend to all directions of the region where the plurality of heat generation components 24 are located. In this case, a plurality of heat conductors 78B corresponding to the heat conductor 78 are disposed in the opening 24Ch, and are disposed to intervene between each of the plurality of heat generation components 24 and the heat conductive plate 70. In this case, it is sufficient that the heat conductors 78C are inserted into one opening 24Ch, thus an operation of locating the heat conductor 78C is easily performed. A cross section of the heat conductor 78C can be increase to achieve favorable heat conductivity.

It is not necessary to form the opening in the case. For example, it is applicable that the heat generation component 24 has contact with an inner surface of the case via the heat conductor, and the heat conductive plate has contact with the case.

<Example of Connection Relationship of Wiring>

Figure 10:
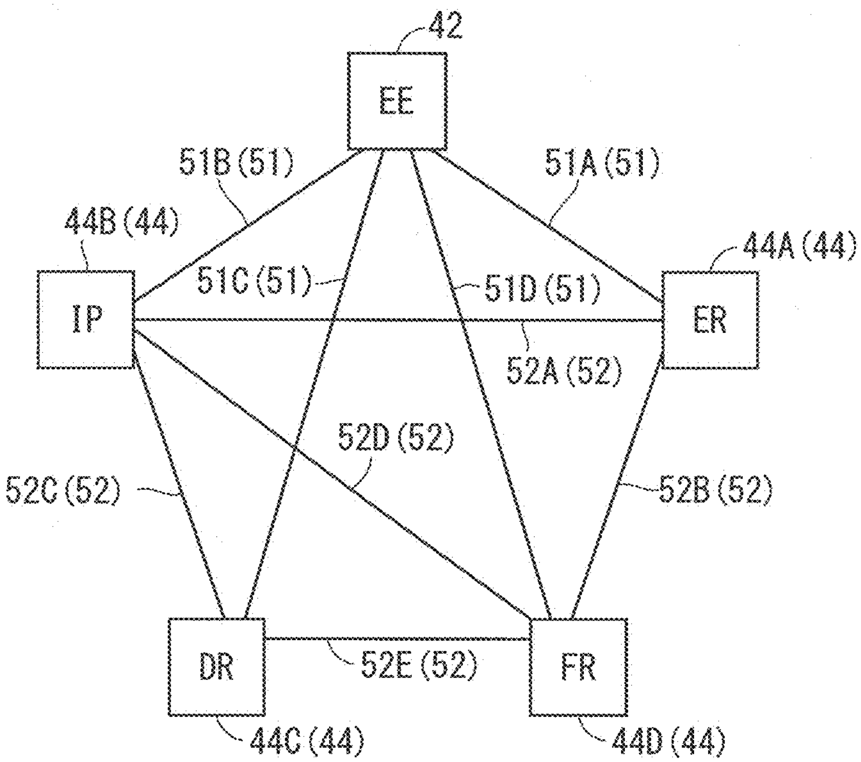
FIG. 10 is a diagram explaining a connection relationship between plural types of connector and a plurality of wirings.
Figure 11:
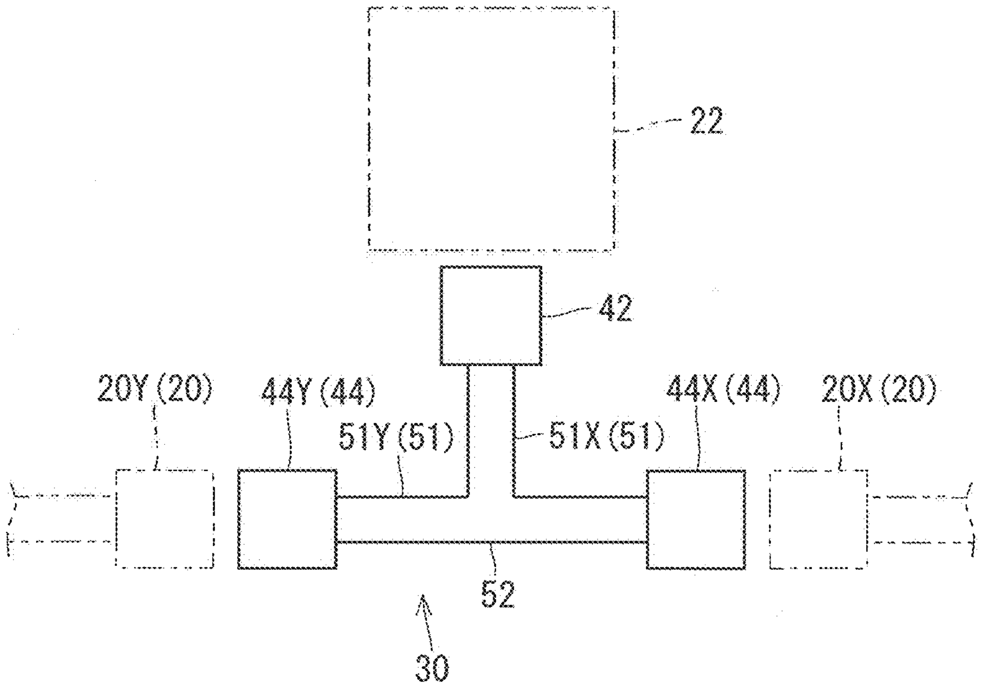
FIG. 11 is a diagram explaining a connection relationship between an apparatus connector, a first harness connector, and a second harness connector.

FIG. 10 is a diagram explaining a connection relationship between the plural types of connectors 42 and 44 and the plurality of wirings 50. FIG. 11 is a diagram explaining a connection relationship between the apparatus connector 42, a first harness connector 44X, and a second harness connector 44Y.

The wire harness 30 includes the apparatus connector 42 and the plural types of harness connectors 44. The apparatus connector 42 is connected to the connector 26 of the electrical apparatus 22. Connectors of the counterpart wire harness 20 different from each other are connected to the plural types of harness connectors 40, respectively. Provided herein as the plural types of harness connectors 44 are an engine room (ER) harness connector 44A, an instrument panel (IP) harness connector 44B, a door (DR) harness connector 44C, and a floor (FL) harness connector 44D. All of the engine room harness connector 44A, the instrument panel harness connector 44B, the door harness connector 44C, and the floor harness connector 44D need not be provided as the plural types of harness connectors 44, however, it is sufficient that two or more types of harness connectors 44 are provided. When the roof harness 20E is assumed as the counterpart wire harness 20, a roof harness connector 44E is provided as one type of the plural types of harness connectors 44. The roof harness connector 44E may be provided on an upper side of the apparatus connector 42, the engine room harness connector 44A, the instrument panel harness connector 44B, the door harness connector 44C, and the floor harness connector 44D in the vehicle, for example. The wiring connected to the roof harness connector 44E may extend in the up-down direction on a lateral side of the apparatus 22.

In the example illustrated in FIG. 2, each type of the connector 40 is one connector. That is to say, each of the apparatus connector 42, the engine room harness connector 44A, the instrument panel harness connector 44B, the door harness connector 44C, and the floor harness connector 44D is one connector. In the present disclosure, two or more connectors are considered one type of connector when the connection destination thereof is the same as each other. In other words, any number of connectors connected to the same apparatus 22 or the same counterpart wire harness 20 are considered one type of connector. From the other viewpoint, each of the plural types of connector 40 is made up of one or more connectors (referred to as a split connector hereinafter). Each type of connector may include a connector having the same structure. Herein, the connectors having the same structure are considered different types of connector when the connection destinations thereof are different from each other.

At least one of the plural types of connector 40 may include two or more split connectors. For example, the connector 40 having a largest number of electrodes (apparatus connector 42, for example) in the plural types of connector 40 may include two or more split connectors. Accordingly, the connector 40 having the largest number of electrodes in the plural types of connector 40 can be easily manufactured.

When the connector 40 includes the plurality of split connectors, it is preferable that the plural types of connector 40 are four or more types of connector, and the number of the split connectors is equal to or smaller than N. Herein, N is a number obtained by subtracting two from the number of types of the plural types of connector 40 in the wire harness 30. Accordingly, the number of groups of connectors to be fitted can be reduced compared with a case where the other type of connector 40 is connected to the connection destination of one type of connector 40. Specifically, the connectors 40 in the wire harness 30 are five types connectors 40 of the apparatus connector 42, the engine room harness connector 44A, the instrument panel harness connector 44B, the door harness connector 44C, and the floor harness connector 44D. Thus, when each of the apparatus connector 42, the engine room harness connector 44A, the instrument panel harness connector 44B, the door harness connector 44C, and the floor harness connector 44D includes a plurality of split connectors, the number thereof is preferably three or less. For example, when each of four counterpart wire harnesses 20 of the engine room harness 20A, the instrument panel harness 20B, the door harness 20C, and the floor harness 20D is connected to the apparatus 22, four groups of connectors need to be fitted. In contrast, when the apparatus connector 42 is made up of three or less split connectors, the number of groups of the connectors to be fitted can be three or less.

The plurality of wirings 50 include a through circuit wiring 52 and a plurality of apparatus wirings 51. The through circuit wiring 52 connects the harness connectors 44. The apparatus wiring 51 connects the apparatus connector 42 and the harness connector 44.

As illustrated in FIG. 3, apparatus wirings 51A, 51B, 51C, and 51D are provided as the apparatus wiring 51 herein. The apparatus wiring 51A connects the engine room harness connector 44A and the apparatus connector 42. The apparatus wiring 51B connects the instrument panel harness connector 44B and the apparatus connector 42. The apparatus wiring 51C connects the door harness connector 44C and the apparatus connector 42. The apparatus wiring 51D connects the floor harness connector 44D and the apparatus connector 42. The number of each of the apparatus wirings 51A, 51B, 51C, and 51D may be one or more.

As illustrated in FIG. 10, through circuit wirings 52A, 52B, 52C, 52D, and 52E are provided herein as the through circuit wiring 52. The through circuit wiring 52A connects the engine room harness connector 44A and the instrument panel harness connector 44B. The through circuit wiring 52B connects the engine room harness connector 44A and the floor harness connector 44D. The through circuit wiring 52C connects the instrument panel harness connector 44B and the door harness connector 44C. The through circuit wiring 52D connects the instrument panel harness connector 44B and the floor harness connector 44D. The through circuit wiring 52E connects the door harness connector 44C and the floor harness connector 44D. The number of each of the through circuit wirings 52A, 52B, 52C, 52D, and 52E may be one or more.

Accordingly, the wiring 50 is provided to nine routes other than one route between the engine room harness connector 44A and the door harness connector 44C in ten routes of five types of connectors 42 and 44.

As illustrated in FIG. 11, in the present disclosure, the plural types of the harness connector 44 include the first harness connector 44X and the second harness connector 44Y. The first harness connector 44X is connected to a first counterpart wire harness 20X. The second harness connector 44Y is connected to a second counterpart wire harness 20Y. Three types of connectors 42 and 44 of the apparatus connector 42, the first harness connector 44X, and the second harness connector 44Y are connected to each other by the wiring 50. Specifically, the first harness connector 44X and the second harness connector 44Y are connected to the apparatus connector 42 by the plurality of apparatus wirings 51. A first apparatus wiring 51X connects the apparatus connector 42 and the first harness connector 44X. A second apparatus wiring 51Y connects the apparatus connector 42 and the second harness connector 44Y. The through circuit wiring 52 connects the first harness connector 44X and the second harness connector 44Y. Described is whether four types of harness connector 44 of the engine room harness connector 44A, the instrument panel harness connector 44B, the door harness connector 44C, and the floor harness connector 44D fall under the first harness connector 44X and the second harness connector 44Y.

Six groups of connectors are generated as a combination made by selecting two of four types of harness connector 44 of the engine room harness connector 44A, the instrument panel harness connector 44B, the door harness connector 44C, and the floor harness connector 44D. Each of five of six groups except for one group made up of the engine room harness connector 44A and the door harness connector 44C includes the through circuit wiring 52 connecting two types of harness connector 44 in each of five groups. All of four types of harness connector 44 of the engine room harness connector 44A, the instrument panel harness connector 44B, the door harness connector 44C, and the floor harness connector 44D are connected to the apparatus connector 42 via the apparatus wiring 51. Thus, five of six groups except for one group made up of the engine room harness connector 44A and the door harness connector 44C can be considered a combination of the first harness connector 44X and the second harness connector 44Y.

In the meanwhile, the wire harness 30 does not include the through circuit wiring 52 connecting the engine room harness connector 44A and the door harness connector 44C. Thus, the engine room harness connector 44A and the door harness connector 44C are not considered a combination of the first harness connector 44X and the second harness connector 44Y.

It is applicable that three or more types of harness connector 44 are provided as the plural types of harness connector 44, and the wire harness 30 includes the through circuit wiring 52 connecting three or more types of harness connector 44. Four groups of connectors are generated as a combination made by selecting three of four types of harness connector 44 of the engine room harness connector 44A, the instrument panel harness connector 44B, the door harness connector 44C, and the floor harness connector 44D. Each of two of four groups except for two groups including the engine room harness connector 44A and the door harness connector 44C together includes the through circuit wiring 52 connecting three types of harness connector 44 in each of four groups. Each of two of four groups except for two groups including the engine room harness connector 44A and the door harness connector 44C together can be considered the three or more types of harness connector 44.

Specifically, the engine room harness connector 44A, the instrument panel harness connector 44B, and the floor harness connector 44D are connected to each other via the through circuit wirings 52A, 52B, and 52D. Thus, a combination of the engine room harness connector 44A, the instrument panel harness connector 44B, and the floor harness connector 44D can be considered the three or more types of harness connector 44. In the similar manner, the instrument panel harness connector 44B, the door harness connector 44C, and the floor harness connector 44D are connected to each other via the through circuit wirings 52C, 52D, and 52E. Thus, a combination of the instrument panel harness connector 44B, the door harness connector 44C, and the floor harness connector 44D can be considered the three or more types of harness connector 44.

However, the through circuit wiring 52 connecting the engine room harness connector 44A and the door harness connector 44C may be provided in the wire harness 30. In this case, the engine room harness connector 44A, the instrument panel harness connector 44B, the door harness connector 44C, and the floor harness connector 44D are connected to each other via the through circuit wiring 52.

The wiring 50 described above is also considered to include the plurality of wirings 51X and 51Y branched from the apparatus connector 42 to be connected to the first harness connector 44X and the second harness connector 44Y.

<Configuration Example for Keeping Wiring in Flat State>

Figure 12:
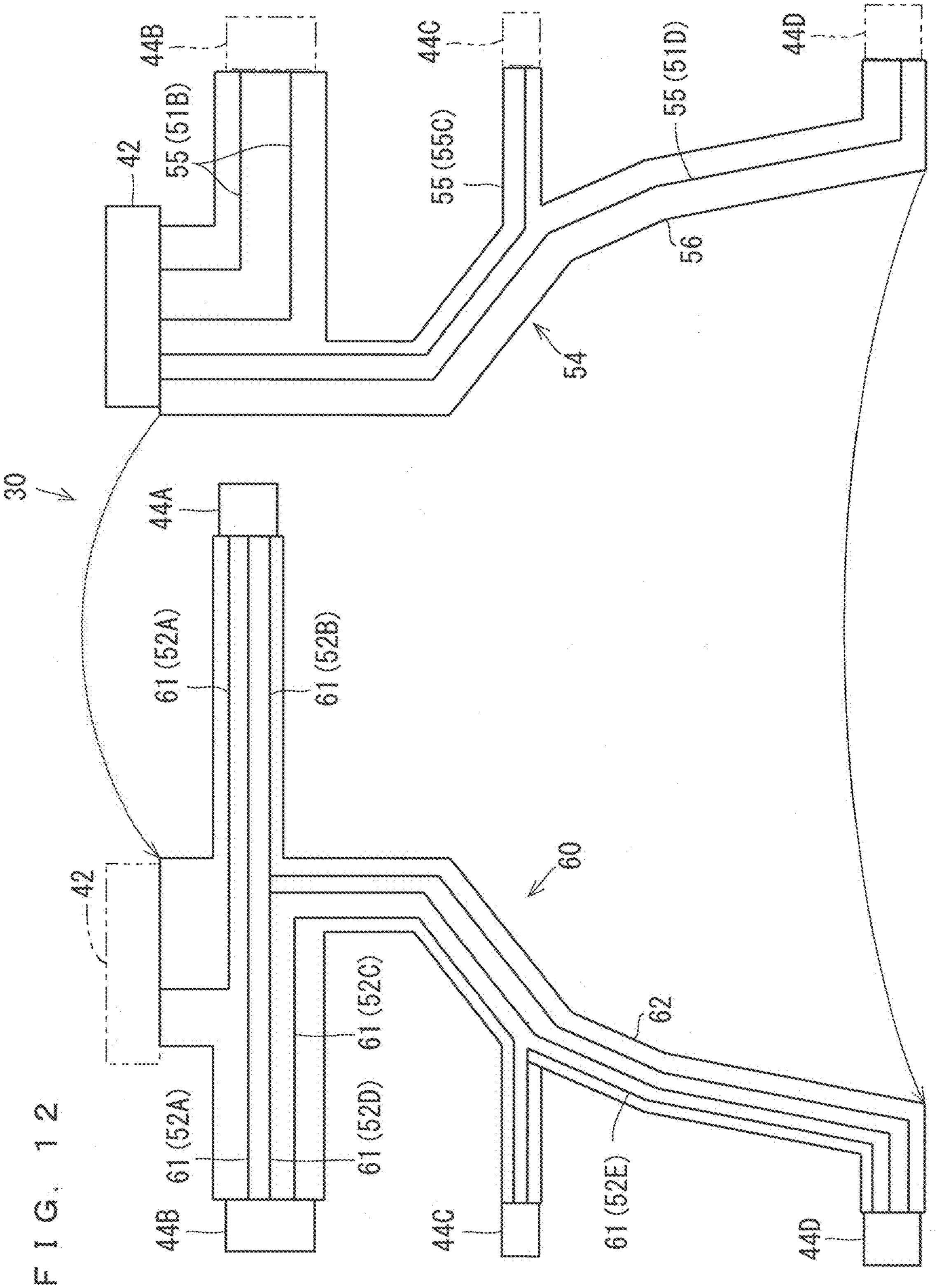
FIG. 12 is an exploded plan view of a wire harness.

FIG. 12 is an exploded plan view of the wire harness 30. The heat conductive plate 70 is omitted in FIG. 12. As illustrated in FIG. 12, in the present embodiment, some of the plurality of wirings 50 are collected to constitute a first wiring group 54, and the other some of the plurality of wirings 50 are collected separately from the first wiring group 54 to constitute a second wiring group 60. Herein, the plurality of wirings 50 are fixed to the base members 56 and 62 and collected.

A way of partitioning the plurality of wirings 50 into the first wiring group 54 and the second wiring group 60 is not particularly limited, but can be appropriately set. Herein, the plurality of wirings 50 are partitioned based on the apparatus wiring 51 and the through circuit wiring 52. Specifically, more than half of the first wiring group 54 are the apparatus wirings 51. More than half of the second wiring group 60 are the through circuit wirings 52. 60% or more, 70% or more, 80% or more, or 90% or more of the first wiring group 54 may be the apparatus wirings 51. All (100%) of the first wiring group 54 may be the apparatus wirings 51. In the similar manner, 60% or more, 70% or more, 80% or more, or 90% or more of the second wiring group 60 may be the through circuit wirings 52. All (100%) of the second wiring group 60 may be the through circuit wirings 52.

In the present example, all (100%) of the first wiring group 54 may be the apparatus wirings 51. 90% or more of the second wiring group 60 are the through circuit wirings 52. Provided to the second wiring group 60 is the apparatus wiring 51A connecting the engine room harness connector 44A and the apparatus connector 42 in the apparatus wirings 51. The apparatus wirings 51B, 51C, and 51D except for the apparatus wiring 51A in the apparatus wirings 51 are provided to the first wiring group 54. All of the through circuit wirings 52 are provided to the second wiring group 60.

Each of the first wiring group 54 and the second wiring group 60 are flatly formed and stacked to each other. Herein, the first wiring group 54 includes a plurality of electrical wires 55 and the flat base member 56 keeping the plurality of electrical wires 55 in a flat state. The electrical wire 55 and the base member 56 are fixed to each other herein. The electrical wire 55 and the base member 56 may not be fixed to each other. The second wiring group 60 includes a plurality of electrical wires 61 and the flat base member 62 keeping the plurality of electrical wires 61 in a flat state. The electrical wire 61 and the base member 62 are fixed to each other herein. The electrical wire 61 and the base member 62 may not be fixed to each other. Each of the electrical wires 55 and 61 are insulated electrical wires each including a core wire and a covering layer covering the core wire. The insulated electrical wire may include a covering layer which is extrusion molded. The insulated electrical wire may be an enamel electrical wire. Each of the base members 56 and 62 may be a member made of resin or metal, or may also be a composite member including both a portion made of resin and a portion made of metal. For example, the base member may be a resin molded component including one or a plurality of grooves which can house the plurality of wirings. The description hereinafter is focused on a relationship between the electrical wire 55 in the first wiring group 54 and the base member 56. The relationship between the electrical wire 55 in the first wiring group 54 and the base member 56 can be applied to a relationship between the electrical wire 61 in the second wiring group 60 and the base member 62.

The plurality of electrical wires 55 are arranged side by side on a main surface of the base member 56. Each electrical wire 55 is fixed to the base member 56, thus a parallel state is maintained. A fixing state of the electrical wire 55 and the base member 56 is not particularly limited, but can be appropriately set. The electrical wire 55 and the base member 56 may be fixed by fusion, for example. In this case, resin included in at least one of the covering of the electrical wire 55 and/or the main surface of the base member 56 is melted, and bonded and fixed to a surface of a counterpart member. The electrical wire 55 and the base member 56 may be attached by an adhesive material or a gluing material, for example.

In the first wiring group 54, the electrical wires 55 are disposed so as not to intersect with each other on the base member 56. Also in the second wiring group 60, the electrical wires 61 are disposed so as not to intersect with each other on the base member 62. Accordingly, increase of the thickness of each of the first wiring group 54 and the second wiring group 60 is suppressed, and increase of the thickness of the wire harness 30 in which the first wiring group 54 and the second wiring group 60 are stacked to each other is suppressed. However, in at least one of the first wiring group 54 and/or the second wiring group 60, an intersection part where the electrical wires intersect with each other on the base member may also be provided.

The base members 56 and 62 may be flexible sheet members 56 and 62. Each of the sheet members 56 and 62 may be a sheet including a fiber material such as a non-woven cloth, for example. Each of the sheet members 56 and 62 may be the sheet having a filled cross-sectional surface. The sheet members 56 and 62 have flexibility so as to be able to follow bending of the electrical wires 55 and 61.

Herein, a part of the wire harness 30 is disposed along the dashboard panel 11. A wiring part extending from the engine room harness connector 44A is held to be disposed along the dashboard panel 11.

The other part of the wire harness 30 is disposed along the cowl side panel 15. The instrument panel harness connector 44B, the door harness connector 44C, and the floor harness connector 44D are held so that they are arranged in a height direction and a wiring part extending from each of the instrument panel harness connector 44B, the door harness connector 44C, and the floor harness connector 44D are disposed along the cowl side panel 15.

In the wire harness 30, the electrical wire 61 and the sheet member 62 are disposed in a bended state in the thickness direction between a portion disposed along the dashboard panel 11 and a portion disposed along the cowl side panel 15. Herein, the portion disposed along the dashboard panel 11 is only the second wiring group 60 in the first wiring group 54 and the second wiring group 60. Thus, the wire harness 30 is easily bended in the thickness direction between the portion disposed along the dashboard panel 11 and the portion disposed along the cowl side panel 15.

The first wiring group 54 and the second wiring group 60 are stacked so that a main surface of the base member 56 to which the electrical wire 55 is fixed and a main surface of the base member 62 to which the electrical wire 61 is fixed face each other. Accordingly, the electrical wires 55 and 61 are surrounded and protected by the base members 56 and 62. However, it is also applicable that the first wiring group 54 and the second wiring group 60 are stacked so that a main surface of the base member 56 to which the electrical wire 55 is fixed and a main surface of the base member 62 to which the electrical wire 61 is not fixed face each other, or are stacked so that a main surface of the base member 62 to which the electrical wire 61 is fixed and a main surface of the base member 56 to which the electrical wire 55 is not fixed face each other. The first wiring group 54 and the second wiring group 60 may be stacked so that a main surface of the base member 56 to which the electrical wire 55 is not fixed and a main surface of the base member 62 to which the electrical wire 62 is not fixed face each other.

The first wiring group 54 and the second wiring group 60 are stacked so that the electrical wire 55 and the electrical wire 61 are overlapped with each other. The electrical wires 55 and 61 have two stages made up of the electrical wire 55 in one stage and the electrical wire 61 in one stage overlapped with each other. There may be a case where a width dimension is desired to be reduced in at least a part of the wire harness 30 even when a thickness dimension increases to some extent depending on a space where the wire harness 30 is disposed. In such a case, the electrical wires 55 and 61 may be stacked in three or more stages, for example. It is also applicable that the base members 56 and 62 are not provided but the electrical wires 55 and 61 are bundled to have a circular shape in cross section by a banding member such as a tape, for example.

The base member 56 includes an extension piece 56*a*. The extension piece 56*a* is provided on both sides of a portion where the electrical wire 55 is disposed. The base member 62 also includes an extension piece 62*a* similar to the extension piece 56*a*. When the extension piece 56*a* of the base member 56 and the extension piece 62*a* of the base member 62 are fixed to each other, the first wiring group 54 and the second wiring group 60 are fixed to each other. However, the extension piece 56*a* of the base member 56 and the extension piece 62*a* of the base member 62 need not be fixed to each other.

The connectors 42 and 44 may be held by the base members 56 and 62. It is also applicable that the electrical wires 55 and 61 extend from end portions of the base members 56 and 62, and the connectors 42 and 44 are provided away from the base members 56 and 62.

A length of each of the plurality of wirings 50 is one meter or less. In the wire harness 30, the longest wiring 50 is the through circuit wiring 52B connecting the engine room harness connector 44A and the floor harness connector 44D or the through circuit wiring 52C connecting the instrument panel harness connector 44B and the floor harness connector 44D. A length of each of these through circuit wirings 52B and 52C is one meter or less.

A configuration for keeping the plurality of wirings 50 in a flat state is not limited to the above example. For example, it is applicable that a protector as a resin molded component forms a housing space along a predetermined route, and the plurality of wirings 50 are housed in the housing space to be kept in a flat state. In this case, it is applicable that a plurality of groove-like housing spaces housing one, two, or three wirings 50 are parallelly formed in a protector, and the plurality of wirings 50 are separately housed in the groove to be kept in a flat state as a whole. It is also applicable that a flat housing space housing the plurality of wirings is formed along a predetermined route in the protector, and the plurality of wirings are housed in the flat housing space to be kept in a flat state. Needless to say, a configuration of parallelly forming these groove-like housing spaces and a configuration of forming the flat housing space may be combined with each other.

The plurality of wirings 50 may be fixed to the heat conductive plate 70 by an adhesive tape, a banding member such as a banding band, a double-sided adhesive tape, or an adhesive agent, for example.

Effect Etc

According to the integrated module 30M or the wire harness 30 having the above configuration, the heat conductive plate 70 is disposed in a position where heat can be transmitted from the heat generation component 24 to the heat conductive plate 70 with respect to the electrical apparatus 22. Thus, heat generated in the heat generation component 24 is easily transmitted to the heat conductive plate 70. The heat conductive plate 70 is the plate extending along the wiring 50, thus the heat is effectively radiated by the heat conductive plate 70. Accordingly, heat radiation properties of the electrical apparatus 22 as the connection destination of the wire harness 30 can be increased.

Particularly, a configuration of locating a zone electrical control unit (ECU) for each zone in the vehicle recently increases separately from a central ECU. At least one of the central ECU and/or the zone ECU is desired to be downsized in consideration of measures against heat. According to the present embodiment, the electrical apparatus 22 is zone ECU, thus measures against the heat for the zone ECU can be achieved, and the zone ECU can be downsized by taking measures against the heat for the zone ECU.

The heat conductive plate 70 includes the wiring overlapping region 72 extending along the wiring 50 and the apparatus overlapping region 74 overlapped with the electrical apparatus 22. Thus, the configuration of transmitting the heat from the heat generation component 24 to the apparatus overlapping region 74 can be easily achieved using the apparatus overlapping region 74.

The heat conductor 78 is made to intervene between the heat generation component 24 and the apparatus overlapping region 74, thus the heat of the heat generation component 24 is effectively transmitted to the heat conductive plate 70 via the heat conductor 78. Accordingly, heat radiation properties of the electrical apparatus 22 is favorably increased.

When the heat conductor 78 is a heat conductive insulation rubber, the heat can be easily transmitted from the heat generation component 24 to the heat conductive plate 70 while the heat generation component 24 and the heat conductive plate 70 are insulated from each other.

When the heat conductor 78 is fixed to the heat conductive plate 70, the heat conductor 78 can be easily made to intervene between the heat generation component 24 and the heat conductive plate 70 in an operation of integrating the electrical apparatus 22 and the wire harness 30.

When the heat conductive plate 70 is fixed to the electrical apparatus 22, the configuration of achieving the transmission of the heat from the heat generation component 24 to the heat conductive plate 70 is easily kept. For example, as described above, the heat conductor 78 is easily made to intervene between the heat generation component 24 and the heat conductive plate 70.

The wire harness 30 includes the apparatus connector 42 and the first harness connector 44X and the second harness connector 44Y to which the connectors of the counterpart wire harnesses 20X and 20Y are connected, respectively, and the wiring 50 includes the plurality of wirings branched from the apparatus connector 42 and connected to the first harness connector 44X and the second harness connector 44Y. Thus, it is sufficient that different connectors are provided to the electrical apparatus 22 for the counterpart wire harnesses 20X and 20Y, however, the connector 26 is provided. Thus, the number of connectors of the electrical apparatus 22 can be reduced. Herein, when the number of connectors is large even in a case where the total number of connector terminals in the electrical apparatus is the same, there is a possibility that a size of the electrical apparatus is increased by a space for locating a connector housing. The number of connectors in the electrical apparatus 22 is reduced, thus the electrical apparatus 22 can be downsized.

The wiring 50 includes the through circuit wiring 52 connecting the first harness connector 44X and the second harness connector 44Y. Thus, the counterpart wire harness 20X connected to the first harness connector 44X and the counterpart wire harness 20Y connected to the second harness connector 44Y are connected to each other via the through circuit wiring 52. Accordingly, plural types of counterpart harnesses can also be connected via the present wire harness 30, thus connection of the plural types of counterpart wire harnesses and connection between the plural types of counterpart wire harness and the apparatus are simplified.

Figure 13:
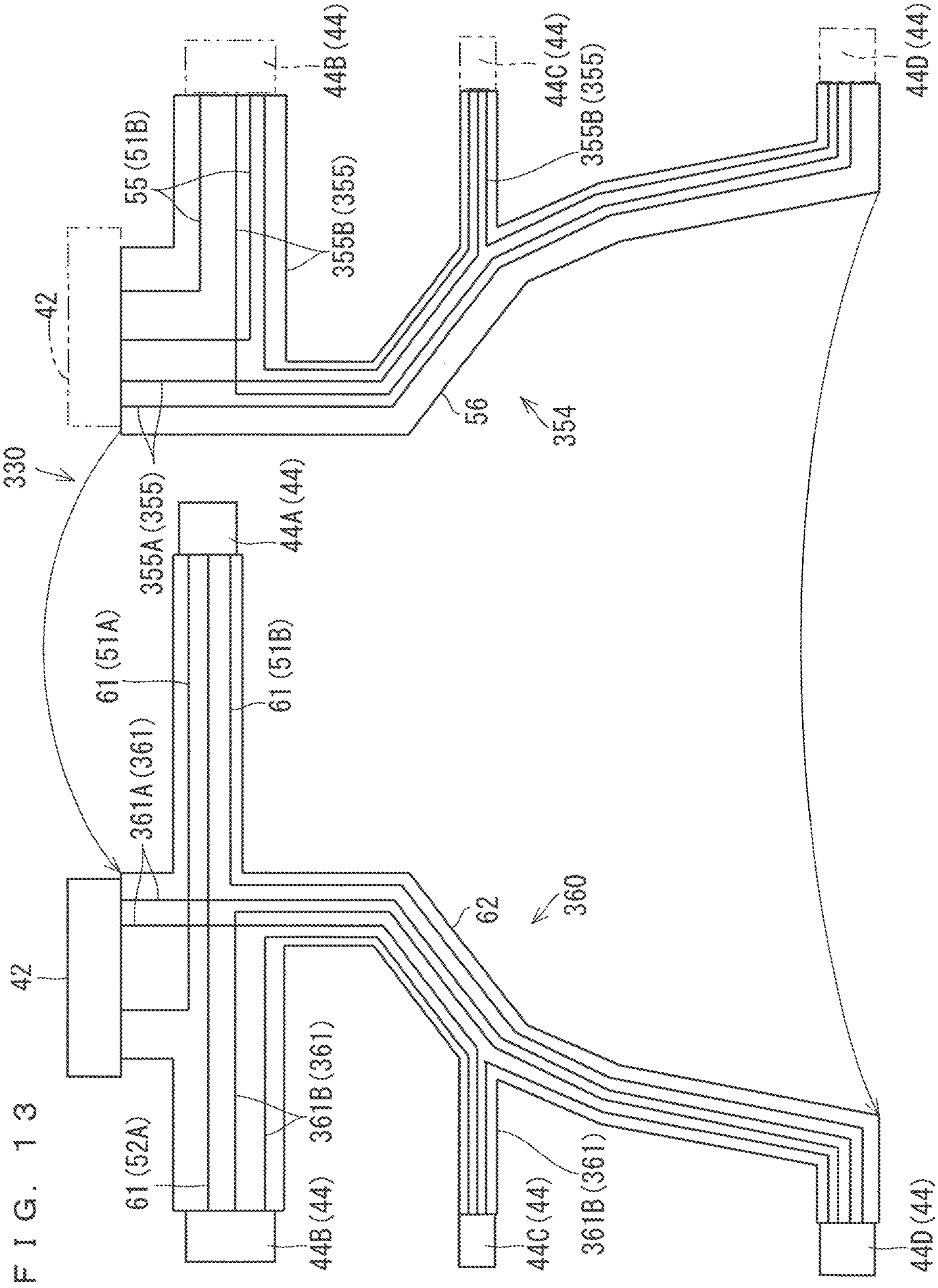
FIG. 13 is an exploded plan view illustrating a wire harness according to a third modification example.

FIG. 13 is an exploded plan view illustrating a wire harness 330 according to a third modification example.

A configuration of dividing the wirings into a first wiring group 354 and a second wiring group 360 in the wire harness 330 according to the third modification example is different from a configuration of dividing the wirings into the first wiring group 54 and the second wiring group 60 in the wire harness 30 described above. Herein, the wirings 50 are divided into the first wiring group 354 and the second wiring group 360 based on whether the wirings 50 are power source lines 355 or signal lines 361. Specifically, more than half of the first wiring group 354 is the power source lines 355, and more than half of the second wiring group 360 are the signal lines 361. A ratio of the power source lines 355 in the first wiring group 354 is higher than that of the power source lines in the second wiring group 360. Accordingly, most of the power source lines 355 and most of the signal lines 361 can be separated.

The ratio of the power source line 355 in the first wiring group 354 is not particularly limited, but can be appropriately set. For example, the ratio of the power source line 355 in the first wiring group 354 may be equal to or larger than 50% or smaller than 50%. That is to say, more than half of the first wiring group 354 may be the power source lines 355 or signal lines.

More than half of all the power source lines in the wire harness 330 may be disposed in the first wiring group 354. More than half of all the signal lines in the wire harness 330 may be disposed in the second wiring group 360. The first wiring group 354 may or may not include the signal line. The second wiring group 360 may or may not include the power source line.

In the example illustrated in FIG. 13, the power source line 355 in the wirings 50 connected to the door harness connector 44C and the wirings 50 connected to the floor harness connector 44D is provided in the first wiring group 354, and the signal line 361 is provided in the second wiring group 360. A power source line 355A in the first wiring group 354 connects each of the door harness connector 44C and the floor harness connector 44D to the apparatus connector 42. A power source line 355B in the first wiring group 354 connects each of the door harness connector 44C and the floor harness connector 44D to the other harness connector 44. A signal line 361A in the second wiring group 360 connects each of the door harness connector 44C and the floor harness connector 44D to the apparatus connector 42. A signal line 361B in the second wiring group 360 connects each of the door harness connector 44C and the floor harness connector 44D to the other harness connector 44.

Figure 14:
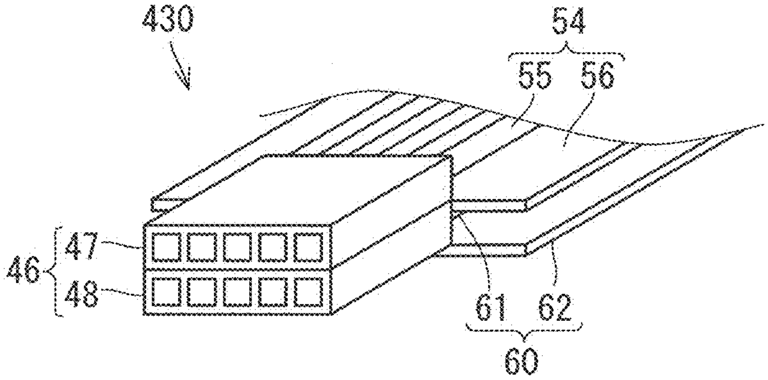
FIG. 14 is a perspective view illustrating a wire harness according to a fourth modification example.
Figure 15:
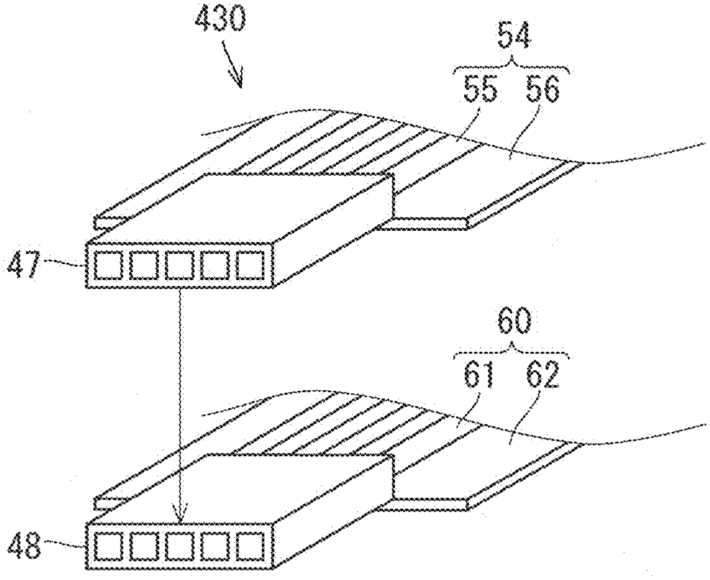
FIG. 15 is an exploded perspective view illustrating the wire harness according to the fourth modification example.

FIG. 14 is a perspective view illustrating a wire harness 430 according to a fourth modification example. FIG. 15 is an exploded perspective view illustrating the wire harness 430 according to the fourth modification example.

A shape of a connector 46 in the wire harness 430 according to the fourth modification example is different from the shape of the connector 44 in the wire harness 30 described above. Specifically, at least one type of connector 44 in the plural types of connector 44 is made up of a plurality of split connectors 47 and 48. The plurality of split connectors 47 and 48 include a first split connector 47 and a second split connector 48. The wiring 50 of the first wiring group 54 is connected to the first split connector 47. The wiring of the second wiring group 60 is connected to the second split connector 48. Accordingly, an operation of inserting one of the wiring 50 of the first wiring group 54 and the wiring 50 of the second wiring group 60 into the connector 44 into which the other one of wiring 50 of the first wiring group 54 and the wiring 50 of the second wiring group 60 is previously inserted hardly occurs compared with the case of the wire harness 30. Accordingly, it is easy to separately manufacture the first wiring group 54 and the second wiring group 60 and subsequently integrate them to constitute the wire harness 430.

Herein, the first split connector 47 and the second split connector 48 are integrated to constitute a stacked connector 46. Accordingly, at least one type of connector 46 in the plural types of connector 40 is the stacked connector 46 made up of the plurality of split connectors 47 and 48 integrated with each other. Each type of connector 44 may be divided in a form other than the stacked connector 46. For example, the apparatus connector 42 may be divided into a plurality of split connectors arranged in a direction intersecting with the thickness direction. It is also applicable that two split connectors are not integrated but are separately connected to the electrical apparatus 22.

Figure 16:
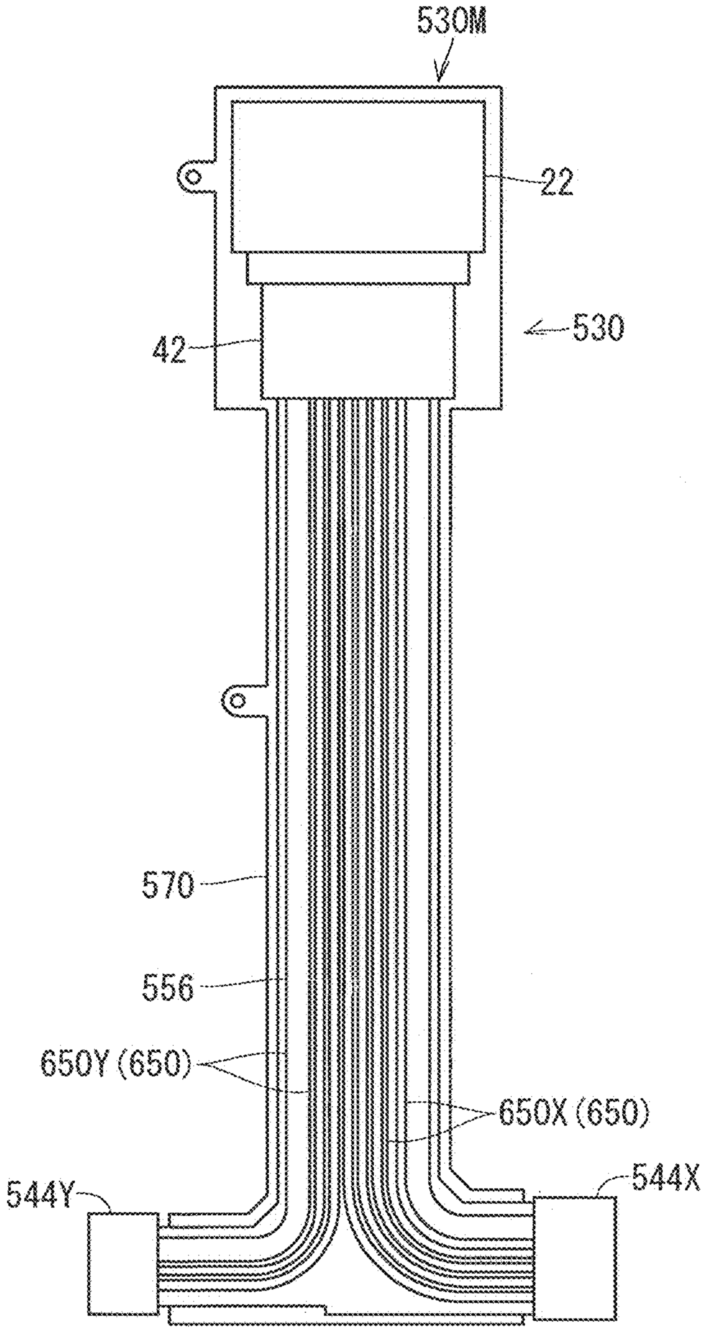
FIG. 16 is a plan view illustrating a module according to a fifth modification example.

FIG. 16 is a plan view illustrating a module 530M according to a fifth modification example.

In the present module 530M, a wiring 650 corresponding to the wiring 50 includes a plurality of wirings 650X and 650Y divided into a plurality of (herein, two) harness connectors 544X and 544Y from the apparatus connector 42. The wiring 650 is fixed to a base member 556 such as a sheet member, and is kept in a flat state.

A heat conductive plate 570 corresponding to the heat conductive plate 70 extends along the wiring 650. The heat conductive plate 570 extends along the base member 556, for example. In the manner similar to the above embodiment, the heat conductive plate 570 is also overlapped with the electrical apparatus 22. In the present modification example, the module 530M does not include a through circuit wiring. The plurality of wirings 50 are not divided into a plurality of groups, but are collected to be kept in a flat form.

Figure 17:
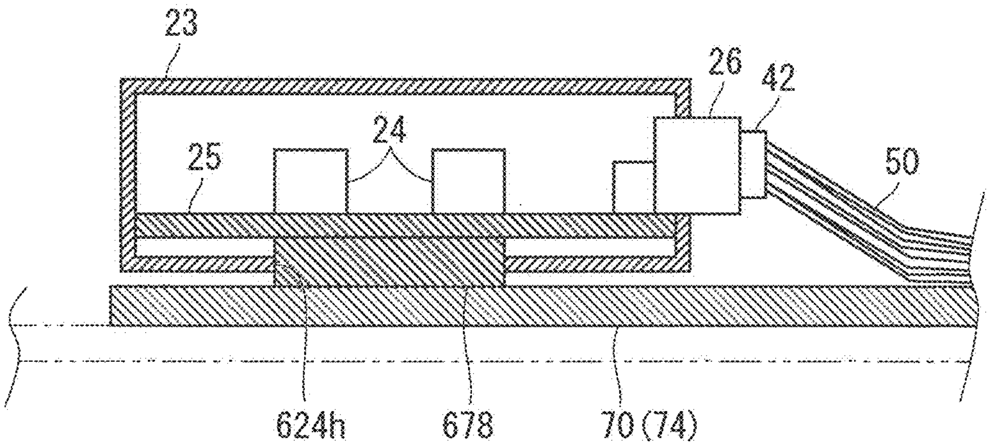
FIG. 17 is a cross-sectional view illustrating a heat conductor according to a sixth modification example.

FIG. 17 is a cross-sectional view illustrating an arrangement example of a heat conductor 678 according to a sixth modification example.

In the above embodiment, the opening 24*h* is formed in the position in the case 23 facing the heat generation component 24, and the heat conductor 78 is disposed in the opening 24*h*. Thus, the heat conductor 78 can face the heat generation component 24 from a side opposite to the circuit substrate 25.

In the present modification example, the apparatus overlapping region 74 of the heat conductive plate 70 is disposed on the case 23 on a side closer to the circuit substrate 25 than the heat generation component 24. An opening 624*h* is formed in a region in the case 23 facing the circuit substrate 25 from a side opposite to the heat generation component 24.

The heat conductor 678 intervenes between the heat conductive plate 70 and the circuit substrate 25 while passing through the opening 624*h*. The heat conductor 678 may have direct contact with the heat conductive plate 70 and the circuit substrate 25. The other inclusion may intervene between the heat conductor 678 and the heat conductive plate 70 or the circuit substrate 25. The inclusion is a heat conductive sheet, a heat conductive adhesive agent, a heat conductive double-sided adhesive tape, or a heat conductive grease increasing adhesiveness to the other member.

According to this modification example, heat of the heat generation component 24 is transmitted to the circuit substrate 25 via a lead of the heat generation component 24 by reason that the heat generation component 24 has contact with the circuit substrate 25. The heat transmitted to the circuit substrate 25 is transmitted from the heat conductor 678 to the heat conductive plate 70, and is radiated. Even when the heat generation component 24 is mounted to the circuit substrate 25 on a side opposite to the heat conductive plate 70, the heat of the heat generation component 24 can be easily radiated via the heat conductive plate 70.

It is also applicable that the opening of the case is formed in a sidewall, and the heat conductor has direct or indirect contact with the side surface of the heat generation component 24 or the circuit substrate 25 through the opening of the sidewall. In this case, it is sufficient that a part of the heat conductive plate is formed to extend to an outer side of the sidewall of the case, and the heat conductor has direct or indirect contact with the extended part. This configuration is effective in a case where the heat generation component 24 is mounted to a position close to a peripheral edge of the circuit substrate 25.

At least some of the plural types of connector may be a standby connector fixed to a vehicle, for example. For example, at least some of the plural types of harness connector 44 may be a standby connector. Accordingly, the counterpart wire harness can be easily connected to the harness connector 44.

The arrangement area of the wire harness 30 may be an area close to a rear seat or a rear luggage, for example. In this case, a floor harness, a sheet harness, or a rear harness, for example, are assumed as the counterpart wire harness 20.

The example that the case 23 and the heat conductive plates 70 and 570 are separately formed is described in the above embodiment and each modification example. The case and the heat conductive plate may be integrally formed with each other. For example, press processing is performed on one metal plate so that a part of the heat conductive plate constitutes the case.

Each configuration described in the embodiments and modification examples thereof can be appropriately combined as long as they are not contradictory.

EXPLANATION OF REFERENCE SIGNS

10 vehicle
11 dashboard panel
12 body part
13 protrusion part
14, 16 through hole
15 cowl side panel
17 instrument panel reinforcement
18 floor panel
18*a* rocker part
19 A pillar
20 counterpart wire harness (20A engine room harness, 20B instrument panel harness, 20C door harness, 20D floor harness, 20E roof harness)
20X first counterpart wire harness
20Y second counterpart wire harness
22 electrical apparatus
23 case
23*h* hole
23*p* fixing piece
24 heat generation component
24*h*, 24Bh, 24Ch, 24*h* opening
25 circuit substrate
26 connector
30, 330, 430 wire harness
30M, 530M integrated module of electrical apparatus and wire harness
42 apparatus connector
44 harness connector (44A engine room harness connector, 44B instrument panel harness connector, 44C door harness connector, 44D floor harness connector, 44E roof harness connector)
44X, 544X first harness connector
44T, 544Y second harness connector
46 stacked connector
47 first split connector
48 second split connector
50, 650, 650X, 650Y wiring
51, 51A, 51B, 51C, 51D apparatus wiring
51X first apparatus wiring
51Y second apparatus wiring
52, 52A, 52B, 52C, 52D, 52E through circuit wiring
54 first wiring group
55, 61 electrical wire
56, 62, 556 sheet member (base member)
56*a*, 62*a* extension piece
60 second wiring group
70, 570 thermal conductive plate
71 fixing piece
71*h* insertion hole
72 wiring overlapping region
74 apparatus overlapping region
78, 78B, 78C heat conductor
78F surface
79 banding member
354 first wiring group
355, 355A, 355B power source line
360 second wiring group
361, 361A, 361B signal line
S screw

The invention claimed is:

1. An integrated module of an electrical apparatus and a wire harness, comprising:

an electrical apparatus including a heat generation component; and a wire harness including a wiring extending from the electrical apparatus and a heat conductive plate extending along the wiring, wherein the heat conductive plate is disposed in a position where heat can be transmitted from the heat generation component to the heat conductive plate with respect to the electrical apparatus, the wire harness is flat as a whole, the heat conductive plate includes a wiring overlapping region extending along the wiring and an apparatus overlapping region overlapped with the electrical apparatus, the wiring overlapping region and the apparatus overlapping region extend in directions along a same planar surface in a plan view, the electrical apparatus is flat in a same direction as the wire harness, the integrated module further comprises a heat conductor intervening between the heat generation component and the apparatus overlapping region, the electrical apparatus includes a case housing the heat generation component, an opening is formed in a position in the case corresponding to the heat generation component, and the heat conductor intervenes between the heat generation component and the apparatus overlapping region while passing through the opening.

2. An integrated module of the electrical apparatus and the wire harness, comprising:

an electrical apparatus including a heat generation component; and a wire harness including a wiring extending from the electrical apparatus and a heat conductive plate extending along the wiring, wherein the heat conductive plate is disposed in a position where heat can be transmitted from the heat generation component to the heat conductive plate with respect to the electrical apparatus, the wire harness is flat as a whole, the heat conductive plate includes a wiring overlapping region extending along the wiring and an apparatus overlapping region overlapped with the electrical apparatus, the wiring overlapping region and the apparatus overlapping region extend in directions along a same planar surface in a plan view, the electrical apparatus is flat in a same direction as the wire harness, the integrated module further comprises a heat conductor intervening between the heat generation component and the apparatus overlapping region, the electrical apparatus includes a substrate to which the heat generation component is mounted, the substrate intervenes between the heat generation component and the heat conductor, and the heat conductor contacts the substrate.

3. The integrated module of the electrical apparatus and the wire harness according to claim 1, wherein the heat conductor includes heat conductive insulation rubber.

4. The integrated module of the electrical apparatus and the wire harness according to claim 1, wherein the heat conductor is fixed to the heat conductive plate.

5. The integrated module of the electrical apparatus and the wire harness according to claim 1, wherein the heat conductive plate is fixed to the electrical apparatus.

6. The integrated module of the electrical apparatus and the wire harness according to claim 1, wherein the wire harness includes an apparatus connector connected to a connector of the electrical apparatus and a first harness connector and a second harness connector to which connectors of counterpart wire harnesses are connected, respectively, and the wiring includes a plurality of wirings branched from the apparatus connector to be connected to the first harness connector and the second harness connector.

7. The integrated module of the electrical apparatus and the wire harness according to claim 6, wherein the wiring includes a through circuit wiring connecting the first harness connector and the second harness connector.

8. A wire harness, comprising:

a wiring including a connector to be connected to an electrical apparatus including a heat generation component, and extending from the electrical apparatus via the connector; and a heat conductive plate extending along the wiring, wherein the heat conductive plate includes a wiring overlapping region extending in a region where the wiring including the connector is overlapped and an apparatus overlapping region overlapped with and contacting the electrical apparatus and disposed in a position where heat can be transmitted from the heat generation component to the heat conductive plate with respect to the electrical apparatus, the wiring overlapping region includes a contact region in which the wiring is fixed to the heat conductive plate, and a non-contact region between the contact region and the apparatus overlapping region, in the non-contact region, the heat conductive plate is overlapped with at least the connector and the wiring adjacent to the connector, and does not contact the connector and the wiring.

9. The wire harness according to claim 8, wherein the wiring overlapping region and the apparatus overlapping region extend in directions along a same planar surface in a plan view.

10. The integrated module of the electrical apparatus and the wire harness according to claim 2, wherein the electrical apparatus includes a case housing the heat generation component, an opening is formed in the case, and the heat conductor passes through the opening.

11. The wire harness according to claim 8, wherein the wiring includes a branched or curved route, and the heat conductive plate has a planar shape extending along the branched route of the wiring.

* * * * *